US010800661B2

(12) United States Patent
Ritter et al.

(10) Patent No.: US 10,800,661 B2
(45) Date of Patent: *Oct. 13, 2020

(54) PREPARATION OF SI-H CONTAINING IODOSILANES VIA HALIDE EXCHANGE REACTION

(71) Applicant: L'Air Liquide, Société Anonyme pour l'Etude et l'Exploitation des Procédés Georges Claude, Paris (FR)

(72) Inventors: Cole Ritter, Easton, PA (US); Gennadiy Itov, Flemington, NJ (US); Manish Khandelwal, Somerset, NJ (US); Jean-Marc Girard, Versailles (FR); Glenn Kuchenbeiser, Fremont, CA (US); Sean Kerrigan, Princeton, NJ (US); Peng Zhang, Montvale, NJ (US); Larry Kit-wing Leung, Annandale, NJ (US); Nicolas Blasco, Grenoble (FR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/460,562

(22) Filed: Jul. 2, 2019

(65) Prior Publication Data
US 2019/0337810 A1 Nov. 7, 2019

Related U.S. Application Data

(60) Division of application No. 15/836,518, filed on Dec. 8, 2017, now Pat. No. 10,384,944, which is a continuation of application No. PCT/US2017/033620, filed on May 19, 2017.

(60) Provisional application No. 62/338,882, filed on May 19, 2016.

(30) Foreign Application Priority Data

Nov. 17, 2017 (TW) .............................. 106139942 A

(51) Int. Cl.
| | | |
|---|---|---|
| *C01B 33/107* | (2006.01) | |
| *C23C 16/455* | (2006.01) | |
| *C23C 16/448* | (2006.01) | |
| *C23C 16/30* | (2006.01) | |

(52) U.S. Cl.
CPC ............ *C01B 33/107* (2013.01); *C23C 16/30* (2013.01); *C23C 16/448* (2013.01); *C23C 16/4481* (2013.01); *C23C 16/45525* (2013.01)

(58) Field of Classification Search
None
See application file for complete search history.

(56) References Cited

U.S. PATENT DOCUMENTS

| | | | |
|---|---|---|---|
| 4,362,885 A | 12/1982 | Panster et al. | |
| 5,997,637 A | 12/1999 | Ikai et al. | |
| 10,384,944 B2 * | 8/2019 | Ritter | .................... C01B 33/107 |
| 2005/0181633 A1 | 8/2005 | Hochberg et al. | |
| 2015/0376211 A1 * | 12/2015 | Girard | ............... C23C 16/45553 |
| | | | 428/447 |
| 2016/0046408 A1 | 2/2016 | Girard | |
| 2016/0115593 A1 | 4/2016 | Kuchenbeiser et al. | |
| 2016/0264426 A1 | 9/2016 | Kerrigan et al. | |

FOREIGN PATENT DOCUMENTS

| | | |
|---|---|---|
| CN | 102911114 | 2/2013 |
| JP | 2000 044580 | 2/2000 |
| JP | 2008 517479 | 5/2008 |
| WO | WO 2006 044019 | 4/2006 |
| WO | WO 2017 201456 | 11/2017 |

OTHER PUBLICATIONS

Arkles, B., Grignard reagents and silanes, reprinted from Handbook of Grignard Reagents, published 1996, Marcel Dekker, Inc., 667-675.
Eaborn, C., Organosilicon compounds: Organosilicon Halides, published 1960, Academic Press Inc., New York, 173-176.
Eaborn, C., Organosilicon compounds. Part II. A "conversion series" for organosilicon halides, pseudohalides, and sulphides, J. Chem. Soc., 1941, 0, 3077-3089.
Emeleus, H.J. et al., Derivatives of monosilane. Part II. The iodo compounds, J. Chem. Soc., 1950, 0, 3077-3089.
Fuchs, P.L. (ed.), Handbook of Reagents for Organic Synthesis, Reagents for Silicon-Mediated Organic Synthesis, Iodotrimethylsilane, John Wley & Sons Ltd., Chichester, Sussex, UK, 2011, 1$^{st}$ ed., 325.
Keinan, E. et al., "Diiodosilane. 1. A novel reagent for deoxygenation of alcohols and ethers," J. Org. Chem. 1987, 52, 4846-4851.
Keinan, E. et al., "Diiodosilane. 2. A multipurpose reagent for hydrolysis and reductive iodination of ketals, acetals, ketones, and aldehydes," J. Org. Chem. 1990, 55, 2927-2938.
Lissel, M. et al., Ein einfaches Verfahren zur Herstellung von Iodotrimethylsilan, published Jun. 1983, publisher Heruntergeladen von: Serials Unit-Periodicals. Urheberrechtlich geschützt, 459, with translation.
Morrison, J.A. et al., "An examination of alkali metal salt cleavage reactions of disilane," Inorganic Chemistry, vol. 6, No. 1, Jan. 1967, 100-102.
Morrison, J.A. et al., "Synthesis and characterization of the (halosilyl)methyl-silanes," Journal of Organometallic Chemistry, 92 (1975) 163-168.

(Continued)

*Primary Examiner* — Clinton A Brooks
*Assistant Examiner* — Kofi Adzamli
(74) *Attorney, Agent, or Firm* — Allen E. White

(57) ABSTRACT

Methods of synthesizing Si—H containing iodosilanes, such as diiodosilane or pentaiododisilane, using a halide exchange reaction are disclosed.

6 Claims, 6 Drawing Sheets

(56) References Cited

OTHER PUBLICATIONS

Newton, A.F. et al., "Combining two-directional synthesis and tandem reactions, part 11: second generation syntheses of (+/−)-hippodamine and (+/−)-epi-hippodamine," Beilstein Journal of Organic Chemistry 2008, 4, No. 4, 1-5.
Noll, W., et al., "Chemistry and technology of silicones," Academic Press, Inc., New York, 1968, 50.
Smith, M.B. et al., "March's advanced organic chemistry: reactions, mechanisms, and structure," Sixth Ed., John Wley & Sons, Inc., Hoboken, New Jersey, 2007, 425-432, 440-450, 478-508, 517-518, and 574-575.
Wiberg, N. et al., "Supersilylsilanes R*SiX 3: Darstellung, Charakterisierung und Strukturen; sterische und van-der-Waals Effekte der Substituenten X [1]," Z. Naturforsch. 55 b, Jan. 24, 2000, 389-405.
Singapore Search Report and Written Opinion for corresponding 11201709441T, dated Oct. 18, 2018.
International Search Report and Written Opinion for corresponding PCT/US2017/033620, dated Aug. 29, 2017.

* cited by examiner

PREPARATION OF SI-H CONTAINING IODOSILANES VIA HALIDE EXCHANGE REACTION

CROSS REFERENCE TO RELATED APPLICATIONS

The present application is a divisional of U.S. patent application Ser. No. 15/836,518, filed Dec. 8, 2017, which is a continuation-in-part of PCT Patent Application Serial No. PCT/US2017/033620 filed May 19, 2017, which claims the benefit of U.S. Provisional Application Ser. No. 62/338,882 filed May 19, 2016, and to Taiwan Patent Application No. 106139942 filed Nov. 17, 2017, all herein incorporated by reference in their entireties for all purposes.

TECHNICAL FIELD TO WHICH THE INVENTION RELATES

Methods of synthesizing Si—H containing iodosilanes, such as diiodosilane or pentaiododisilane, using a halide exchange reaction are disclosed.

BACKGROUND OF THE INVENTION

Halosilane chemicals find many uses in industry. In particular, iodosilane precursors, such as diiodosilane ($SiH_2I_2$), are used to deposit a variety of silicon containing films for use in semiconductor manufacturing processes.

Emeléus et al., disclose synthesis of diiodosilane ($SiH_2I_2$) by reaction of Silane ($SiH_4$), Hydrogen Iodide (HI), and aluminum iodide ($AlI_3$). Derivatives of monosilane. Part II. The Iodo compounds: Emeleus, H. J.; Maddock, A. G.; Reid, C., J. Chem. Soc. 1941, 353-358). The reaction produces the desired $SiH_2I_2$ reaction product along with Iodosilane ($SiH_3I$), Triiodosilane ($SiHI_3$), and tetraiodosilane ($SiI_4$). Id. at p. 354.

Keinan et al. disclose the reaction of iodine and phenylsilane in a 1:1 molar ratio in the presence of traces of ethyl acetate at −20° C. produces 1 mol of $SiH_2I_2$ and 1 mol of benzene. J. Org. Chem., Vol. 52, No. 22, 1987, pp. 4846-4851. Although selective for $SiH_2I_2$ over the other possible iodosilanes (i.e., $SiH_3I$, $SiHI_3$, and $SiI_4$), this method produces the known human carcinogen benzene, which makes commercial implementation difficult. Despite this drawback, it remains the preferred synthetic approach to producing Diiodosilane.

Impurities from these synthesis processes, such as hydrogen iodide and/or iodine, may decompose the resulting iodosilane product. Current industrial practice is to stabilize these products using antimony, silver, or copper powder/pellet additives as taught in Eaborn, 'Organosilicon Compounds. Part II. 'A Conversion Series for Organosilicon Halides, Pseudohalides, and Sulphides', 1950, J. Chem. Soc., 3077-3089 and Beilstein 4, IV, 4009. Although the addition of copper may stabilize the product, it also may introduce impurities (Cu) which may adversely affect the electrical properties of the deposited films.

The so-called Finkelstein reaction is an $S_N2$ reaction (Substitution Nucleophilic Bimolecular reaction) that involves the exchange of one halogen atom for another. Halide exchange is an equilibrium reaction, but the reaction can be driven to completion by exploiting the differential solubility of halide salts, or by using a large excess of the halide salt. Smith et al., (2007), *Advanced Organic Chemistry: Reactions, Mechanisms, and Structure* (6th ed.), New York: Wiley-Interscience.

For example, the preparation of trimethylsilyl iodide (TMS-I) via reactions of trimethylsilyl chloride and lithium iodide in chloroform or sodium iodide in acetonitrile has been reported (Eq. 4). Handbook of Reagents for Organic Synthesis, Reagents for Silicon-Mediated Organic Synthesis, Iodotrimethylsilane, Wiley 2011, p. 325

(4)

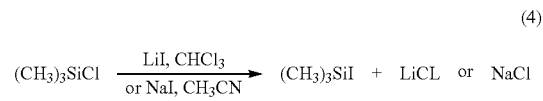

While Si—Cl is reactive to iodine exchange by this route, R groups like alkyl or aryl groups are not. On the other hand, Si—H bonds are found in general to be more reactive than the Si—Cl bond. Chemistry and Technology of Silicones, Academic Press, 1968, p. 50. As a result, one of ordinary skill in the art would expect exchange of both the H and Cl atoms of any Si—H containing halosilane in the Finkelstein reaction.

A need remains for commercially viable synthesis and supply of stable Si—H containing iodosilanes, such as diiodosilane, suitable for use in the semiconductor industry.

BRIEF SUMMARY

Methods of synthesizing Si—H containing iodosilanes are disclosed. The Si—H containing iodosilanes have the formula

  (1)

  (2) or

  (3)

wherein w is 1 to 3, x+y+z=2w+2, x is 1 to 2w+1, y is 0 to 2w+1, z is 1 to 2w+1, each a is independently 0 to 3, each b is independently 0 to 3, each c is independently 0 to 3, a+b+c=3 provided that at least one a and at least one c is 1, each m is independently 0 to 3, each n is independently 0 to 3, each o is independently 0 to 3, m+n+o=3 provided that at least one m and at least one o is 1, and each R is independently a C1 to C12 hydrocarbyl group, Cl, Br, or a $ER'_3$ group, wherein each E is independently Si or Ge and each R' is independently H or a C1 to C12 hydrocarbyl group. A halosilane reactant having the formula $Si_wH_xR_yX_z$, $N(SiH_aR_bX_c)_3$, or $(SiH_mR_nX_o)_2$—$CH_2$, wherein X is Cl or Br, and w, x, y, z, a, b, c, m, n, and o are as defined above, is reacted with an alkali metal halide reactant having the formula MI, wherein M=Li, Na, K, Rb, or Cs, to produce a mixture of $Si_wH_xR_yI_z$, $N(SiH_aR_bI_c)_3$ or $(SiH_mR_nI_o)_2$—$CH_2$ and MX. The Si—H containing iodosilane having the formula $Si_wH_xR_yI_z$, $N(SiH_aR_bI_c)_3$ or $(SiH_mR_nI_o)_2$—$CH_2$ is isolated from the mixture. Alternatively, the halosilane reactant is contacted with the alkali metal halide reactant to produce the combination of MX and $Si_wH_xR_yI_z$, $N(SiH_aR_bI_c)_3$ or $(SiH_mR_nI_o)_2$—$CH_2$. The Si—H containing iodosilane having the formula $Si_wH_xR_yI_z$, $N(SiH_aR_bI_c)_3$ or $(SiH_mR_nI_o)_2$—$CH_2$ is isolated from the mixture. Either of the disclosed methods may have one or more of the following aspects:

R is not Cl or Br;
R is a C1 to C12 hydrocarbyl group;
R is a C1 to C4 hydrocarbyl group;
R is a $ER'_3$ group;
M=Li;
y=0;
z=2 to 2w+1;

adding a solvent to the reacting step;
the solvent being the Si—H containing iodosilane;
the solvent being an alkane;
the solvent being propane, butane, pentane, hexane, heptanes, chloromethane, dichloromethane, chloroform, carbon tetrachloride, methylene chloride, acetonitrile, and combinations thereof;
the solvent being pentane;
the isolating step comprising filtering the mixture to separate MX from the Si—H containing iodosilane having the formula $Si_wH_xR_yI_z$;
the halosilane reactant being $SiH_2Cl_2$;
the halosilane reactant being $Si_2HCl_5$;
the halosilane reactant being $(SiH_3)_2N(SiH_2Cl)$;
the alkali metal halide reactant being LiI;
the Si—H containing iodosilanes have the formula $Si_wH_xR_yI_z$ (1);
the Si—H containing iodosilane having the formula $SiH_xI_{4-x}$, wherein x=1 to 3;
the Si—H containing iodosilane being $SiHI_3$;
the Si—H containing iodosilane being $SiH_2I_2$;
the Si—H containing iodosilane being $SiH_3I$;
the Si—H containing iodosilane having the formula $SiH_xR_yI_{4-x-y}$, wherein x=1 to 2, y=1 to 2, x+y is less than or equal to 3, and each R is independently a C1 to C12 hydrocarbyl group, Cl, Br, or a $ER'_3$ group, wherein each E is independently Si or Ge and each R' is independently H or a C1 to C12 hydrocarbyl group;
the Si—H containing iodosilane being $MeSiHI_2$;
the Si—H containing iodosilane being $MeSiH_2I$;
the Si—H containing iodosilane being $Me_2SiHI$;
the Si—H containing iodosilanes being $EtSiHI_2$;
the Si—H containing iodosilane being $EtSiH_2I$;
the Si—H containing iodosilane being $Et_2SiHI$;
the Si—H containing iodosilane being $ClSiHI_2$;
the Si—H containing iodosilane being $ClSiH_2I$;
the Si—H containing iodosilane being $Cl_2SiHI$;
the Si—H containing iodosilane being $BrSiHI_2$;
the Si—H containing iodosilane being $BrSiH_2I$;
the Si—H containing iodosilane being $BrI_2SiHI$;
the Si—H containing iodosilane being $H_3SiSiHI_2$;
the Si—H containing iodosilane being $H_3SiSiH_2I$;
the Si—H containing iodosilane being $(H_3Si)_2SiHI$;
the Si—H containing iodosilane being $H_3GeSiHI_2$;
the Si—H containing iodosilane being $H_3GeSiH_2I$;
the Si—H containing iodosilane being $(H_3Ge)_2SiHI$;
the Si—H containing iodosilane being $Me_3SiSiHI_2$;
the Si—H containing iodosilane being $Me_3SiSiH_2I$;
the Si—H containing iodosilane being $(Me_3Si)_2SiHI$;
the Si—H containing iodosilane being $Me_3GeSiHI_2$;
the Si—H containing iodosilane being $Me_3GeSiH_2I$;
the Si—H containing iodosilane being $(Me_3Ge)_2SiHI$;
the Si—H containing iodosilane being $Me_2HSiSiHI_2$;
the Si—H containing iodosilane being $Me_2HSiSiH_2I$;
the Si—H containing iodosilane being $(Me_2HSi)_2SiHI$;
the Si—H containing iodosilane being $Me_2HGeSiHI_2$;
the Si—H containing iodosilane being $Me_2HGeSiH_2I$;
the Si—H containing iodosilane being $(Me_2HGe)_2SiHI$;
the Si—H containing iodosilane having the formula $Si_2H_xI_{6-x}$, wherein x=1-5;
the Si—H containing iodosilane being $Si_2HI_5$;
the Si—H containing iodosilane being $Si_2H_2I_4$;
the Si—H containing iodosilane being $Si_2H_3I_3$;
the Si—H containing iodosilane being $Si_2H_4I_2$;
the Si—H containing iodosilane being $Si_2H_5I$;
the Si—H containing iodosilane having the formula $Si_2H_xR_yI_{6-x-y}$, wherein x=1 to 4, y=1 to 4, x+y is less than or equal to 5, and each R is independently a C1 to C12 hydrocarbyl group, Cl, Br, or a $ER'_3$ group, wherein each E is independently Si or Ge and each R' is independently H or a C1 to C12 hydrocarbyl group;
the Si—H containing iodosilane being $MeSi_2HI_4$;
the Si—H containing iodosilane being $MeSi_2H_2I_3$;
the Si—H containing iodosilane being $MeSi_2H_3I_2$;
the Si—H containing iodosilane being $MeSi_2H_4I$;
the Si—H containing iodosilane being $Me_2Si_2HI_3$;
the Si—H containing iodosilane being $Me_2Si_2H_2I_2$;
the Si—H containing iodosilane being $Me_2Si_2H_3I$;
the Si—H containing iodosilane being $Me_3Si_2HI_2$;
the Si—H containing iodosilane being $Me_3Si_2H_2I$;
the Si—H containing iodosilane being $Me_4Si_2HI$,
the Si—H containing iodosilane being $EtSi_2HI_4$;
the Si—H containing iodosilane being $EtSi_2H_2I_3$;
the Si—H containing iodosilane being $EtSi_2H_3I_2$;
the Si—H containing iodosilane being $EtSi_2H_4I$;
the Si—H containing iodosilane being $Et_2Si_2HI_3$;
the Si—H containing iodosilane being $Et_2Si_2H_2I_2$;
the Si—H containing iodosilane being $Et_2Si_2H_3I$;
the Si—H containing iodosilane being $Et_3Si_2HI_2$;
the Si—H containing iodosilane being $Et_3Si_2H_2I$;
the Si—H containing iodosilane being $Et_4Si_2HI$,
the Si—H containing iodosilane being $ClSi_2HI_4$;
the Si—H containing iodosilane being $ClSi_2H_2I_3$;
the Si—H containing iodosilane being $ClSi_2H_3I_2$;
the Si—H containing iodosilane being $ClSi_2H_4I$;
the Si—H containing iodosilane being $Cl_2Si_2HI_3$;
the Si—H containing iodosilane being $Cl_2Si_2H_2I_2$;
the Si—H containing iodosilane being $Cl_2Si_2H_3I$;
the Si—H containing iodosilane being $Cl_3Si_2HI_2$;
the Si—H containing iodosilane being $Cl_3Si_2H_2I$;
the Si—H containing iodosilane being $Cl_4Si_2HI$,
the Si—H containing iodosilane being $BrSi_2HI_4$;
the Si—H containing iodosilane being $BrSi_2H_2I_3$;
the Si—H containing iodosilane being $BrSi_2H_3I_2$;
the Si—H containing iodosilane being $BrSi_2H_4I$;
the Si—H containing iodosilane being $Br_2Si_2HI_3$;
the Si—H containing iodosilane being $Br_2Si_2H_2I_2$;
the Si—H containing iodosilane being $Br_2Si_2H_3I$;
the Si—H containing iodosilane being $Br_3Si_2H_{12}$;
the Si—H containing iodosilane being $Br_3Si_2H_2I$;
the Si—H containing iodosilane being $Br_4Si_2HI$,
the Si—H containing iodosilane being $H_3SiSi_2HI_4$;
the Si—H containing iodosilane being $H_3SiSi_2H_2I_3$;
the Si—H containing iodosilane being $H_3SiSi_2H_3I_2$;
the Si—H containing iodosilane being $H_3SiSi_2H_4I$;
the Si—H containing iodosilane being $(H_3Si)_2Si_2HI_3$;
the Si—H containing iodosilane being $(H_3Si)_2Si_2H_2I_2$;
the Si—H containing iodosilane being $(H_3Si)_2Si_2H_3I$;
the Si—H containing iodosilane being $(H_3Si)_3Si_2HI_2$;
the Si—H containing iodosilane being $(H_3Si)_3Si_2H_2I$;
the Si—H containing iodosilane being $(H_3Si)_4Si_2HI$,
the Si—H containing iodosilane being $H_3GeSi_2HI_4$;
the Si—H containing iodosilane being $H_3GeSi_2H_2I_3$;
the Si—H containing iodosilane being $H_3GeSi_2H_3I_2$;
the Si—H containing iodosilane being $H_3GeSi_2H_4I$;
the Si—H containing iodosilane being $(H_3Ge)_2Si_2HI_3$;
the Si—H containing iodosilane being $(H_3Ge)_2Si_2H_2I_2$;
the Si—H containing iodosilane being $(H_3Ge)_2Si_2H_3I$;
the Si—H containing iodosilane being $(H_3Ge)_3Si_2HI_2$;
the Si—H containing iodosilane being $(H_3Ge)_3Si_2H_2I$;
the Si—H containing iodosilane being $(H_3Ge)_4Si_2HI$,
the Si—H containing iodosilane being $Me_3SiSi_2HI_4$;

the Si—H containing iodosilane being Me$_3$SiSi$_2$H$_2$I$_3$;
the Si—H containing iodosilane being Me$_3$SiSi$_2$H$_3$I$_2$;
the Si—H containing iodosilane being Me$_3$SiSi$_2$H$_4$I;
the Si—H containing iodosilane being (Me$_3$Si)$_2$Si$_2$HI$_3$;
the Si—H containing iodosilane being (Me$_3$Si)$_2$Si$_2$H$_2$I$_2$;
the Si—H containing iodosilane being (Me$_3$Si)$_2$Si$_2$H$_3$I;
the Si—H containing iodosilane being (Me$_3$Si)$_3$Si$_2$HI$_2$;
the Si—H containing iodosilane being (Me$_3$Si)$_3$Si$_2$H$_2$I;
the Si—H containing iodosilane being (Me$_3$Si)$_4$Si$_2$HI,
the Si—H containing iodosilane being Me$_3$GeSi$_2$HI$_4$;
the Si—H containing iodosilane being Me$_3$GeSi$_2$H$_2$I$_3$;
the Si—H containing iodosilane being Me$_3$GeSi$_2$H$_3$I$_2$;
the Si—H containing iodosilane being Me$_3$GeSi$_2$H$_4$I;
the Si—H containing iodosilane being (Me$_3$Ge)$_2$Si$_2$HI$_3$;
the Si—H containing iodosilane being (Me$_3$Ge)$_2$Si$_2$H$_2$I$_2$;
the Si—H containing iodosilane being (Me$_3$Ge)$_2$Si$_2$H$_3$I;
the Si—H containing iodosilane being (Me$_3$Ge)$_3$Si$_2$HI$_2$;
the Si—H containing iodosilane being (Me$_3$Ge)$_3$Si$_2$H$_2$I;
the Si—H containing iodosilane being (Me$_3$Ge)$_4$Si$_2$HI,
the Si—H containing iodosilane being Me$_2$HSiSi$_2$HI$_4$;
the Si—H containing iodosilane being Me$_2$HSiSi$_2$H$_2$I$_3$;
the Si—H containing iodosilane being Me$_2$HSiSi$_2$H$_3$I$_2$;
the Si—H containing iodosilane being Me$_2$HSiSi$_2$H$_4$I;
the Si—H containing iodosilane being (Me$_2$HSi)$_2$Si$_2$HI$_3$;
the Si—H containing iodosilane being (Me$_2$HSi)$_2$Si$_2$H$_2$I$_2$;
the Si—H containing iodosilane being (Me$_2$HSi)$_2$Si$_2$H$_3$I;
the Si—H containing iodosilane being (Me$_2$HSi)$_3$Si$_2$HI$_2$;
the Si—H containing iodosilane being (Me$_2$HSi)$_3$Si$_2$H$_2$I;
the Si—H containing iodosilane being (Me$_2$HSi)$_4$Si$_2$HI,
the Si—H containing iodosilane being Me$_2$HGeSi$_2$HI$_4$;
the Si—H containing iodosilane being Me$_2$HGeSi$_2$H$_2$I$_3$;
the Si—H containing iodosilane being Me$_2$HGeSi$_2$H$_3$I$_2$;
the Si—H containing iodosilane being Me$_2$HGeSi$_2$H$_4$I;
the Si—H containing iodosilane being (Me$_2$HGe)$_2$Si$_2$HI$_3$;
the Si—H containing iodosilane being (Me$_2$HGe)$_2$Si$_2$H$_2$I$_2$;
the Si—H containing iodosilane being (Me$_2$HGe)$_2$Si$_2$H$_3$I;
the Si—H containing iodosilane being (Me$_2$HGe)$_3$Si$_2$HI$_2$;
the Si—H containing iodosilane being (Me$_2$HGe)$_3$Si$_2$H$_2$I;
the Si—H containing iodosilane being (Me$_2$HGe)$_4$Si$_2$HI,
the Si—H containing iodosilane having the formula Si$_3$H$_x$I$_{8-x}$, wherein x=1 to 8;
the Si—H containing iodosilane being Si$_3$H$_7$I;
the Si—H containing iodosilane being Si$_3$H$_6$I$_2$;
the Si—H containing iodosilane being Si$_3$H$_5$I$_3$;
the Si—H containing iodosilane being Si$_3$H$_4$I$_4$;
the Si—H containing iodosilane being Si$_3$H$_3$I$_5$;
the Si—H containing iodosilane being Si$_3$H$_2$I$_6$;
the Si—H containing iodosilane being Si$_3$HI$_7$;
the Si—H containing iodosilane having the formula N(SiH$_a$I$_c$)$_3$, wherein each a is independently 0 to 3 and each c is independently 0 to 3, provided that at least one a and at least one c is 1;
the Si—H containing iodosilane being N(SiH$_3$)$_2$(SiH$_2$I);
the Si—H containing iodosilane being N(SiH$_3$)$_2$(SiHI$_2$);
the Si—H containing iodosilane being N(SiH$_3$)(SiH$_2$I)$_2$;
the Si—H containing iodosilane being N(SiH$_3$)(SiHI$_2$)$_2$;
the Si—H containing iodosilane being N(SiHI$_2$)$_2$(SiH$_2$I);
the Si—H containing iodosilane being N(SiHI$_2$)(SiH$_2$I)$_2$;
the Si—H containing iodosilane being N(SiH$_2$I)$_3$;
the Si—H containing iodosilane being N(SiHI$_2$)$_3$;
the Si—H containing iodosilane having the formula N(SiH$_a$R$_b$I$_c$)$_3$, wherein each a is independently 0 to 3, each b is independently 0 to 3, each c is independently 0 to 3, a+b+c=3, and each R is independently a C1 to C12 hydrocarbyl group, Cl, Br, or a ER'$_3$ group, wherein each E is independently Si or Ge and each R' is independently H or a C1 to C12 hydrocarbyl group, provided that (a) at least one x, at least one y, and at least one z is 1, and (b) that at least one Si is bonded to both H and I;
the Si—H containing iodosilane being N(SiH$_3$)$_2$(SiMeHI);
the Si—H containing iodosilane being N(SiH$_2$Me)$_2$(SiMeHI);
the Si—H containing iodosilane being N(SiHMe$_2$)$_2$(SiMeHI);
the Si—H containing iodosilane being N(SiMe$_2$H)$_2$(SiH$_2$I);
the Si—H containing iodosilane being N(SiMe$_3$)$_2$(SiH$_2$I);
the Si—H containing iodosilane being N(SiMe$_2$H)$_2$(SiHI$_2$);
the Si—H containing iodosilane being N(SiMe$_3$)$_2$(SiHI$_2$);
the Si—H containing iodosilanes have the formula (SiH$_m$R$_n$I$_o$)$_2$—CH$_2$ (3);
the Si—H containing iodosilane having the formula (SiH$_x$I$_y$)$_2$CH$_2$, wherein each x is independently 0 to 3, each y is independently 0 to 3, provided that at least one x and at least one y is 1;
the Si—H containing iodosilane being (SiH$_2$I)$_2$—CH$_2$;
the Si—H containing iodosilane being (SiHI$_2$)$_2$—CH$_2$;
the Si—H containing iodosilane being (SiH$_2$I)—CH$_2$—(SiH$_3$);
the Si—H containing iodosilane being (SiHI$_2$)—CH$_2$—(SiH$_3$); or
the Si—H containing iodosilane being (SiH$_2$I)—CH$_2$—(SiHI$_2$).

Also disclosed are Si-containing film forming compositions comprising any of the Si—H containing iodosilanes listed above. The disclosed Si-containing film forming compositions comprise one or more of the following aspects:

the Si-containing film forming composition comprising between approximately 99% v/v and approximately 100% v/v of one Si—H containing iodosilane;

the Si-containing film forming composition comprising between approximately 99.5% v/v and approximately 100% v/v of one Si—H containing iodosilane;

the Si-containing film forming composition comprising between approximately 99.97% v/v and approximately 100% v/v of one Si—H containing iodosilane;

the Si-containing film forming composition containing between approximately 0 ppbw and approximately 100 ppbw Cu;

the Si-containing film forming composition containing between approximately 0 ppbw and approximately 100 ppbw Ag;

the Si-containing film forming composition containing between approximately 0 ppbw and approximately 100 ppbw Sb;

the Si-containing film forming composition containing between approximately 0 ppbw and approximately 50 ppbw Cu;

the Si-containing film forming composition containing between approximately 0 ppbw and approximately 50 ppbw Ag;

the Si-containing film forming composition containing between approximately 0 ppbw and approximately 50 ppbw Sb;

the Si-containing film forming composition containing between approximately 0 ppbw and approximately 10 ppbw Cu;

the Si-containing film forming composition containing between approximately 0 ppbw and approximately 10 ppbw Ag;

the Si-containing film forming composition containing between approximately 0 ppbw and approximately 10 ppbw Sb; or the Si-containing film forming composition containing between approximately 0 ppmw and approximately 100 ppmw C.

Also disclosed is a Si-containing film forming composition delivery device comprising a canister having an inlet conduit and an outlet conduit and containing any of the Si-containing film forming compositions disclosed above. The disclosed device may include one or more of the following aspects:

an end of the inlet conduit located above a surface of the Si-containing film forming composition and an end of the outlet conduit located below the surface of the Si-containing film forming composition;

an end of the inlet conduit located below a surface of the Si-containing film forming composition and an end of the outlet conduit located above the surface of the Si-containing film forming composition;

further comprising a diaphragm valve on the inlet and the outlet;

an internal surface of the canister being glass;

an internal surface of the canister being passivated stainless steel;

the canister being light-resistant glass with a light resistant coating on an external surface of the canister;

an internal surface of the canister being aluminum oxide;

further comprising one or more barrier layers on an interior surface of the canister;

further comprising one to four barrier layers on an interior surface of the canister;

further comprising one or two barrier layers on an interior surface of the canister;

each barrier layer comprising a silicon oxide layer, silicon nitride layer, silicon oxynitride layer, silicon carbonitride, silicon oxycarbonitride layer, or combinations thereof;

wherein each barrier layer is 1 to 100 nm in thickness; or wherein each barrier layer is 2 to 10 nm in thickness.

Notation and Nomenclature

Certain abbreviations, symbols, and terms are used throughout the following description and claims, and include:

As used herein, the indefinite article "a" or "an" means one or more than one.

As used herein, the terms "approximately" or "about" mean±10% of the value stated.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three R' groups may, but need not be identical to each other or to $R^2$ or to $R^3$. Further, it should be understood that unless specifically stated otherwise, values of R groups are independent of each other when used in different formulas.

As used herein, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, n-propyl groups, n-butyl groups, etc. Examples of branched alkyls groups include without limitation, iso-propyl, t-butyl. Examples of cyclic alkyl groups include without limitation, cyclopropyl groups, cyclopentyl groups, cyclohexyl groups, etc.

As used herein, the term "aryl" refers to aromatic ring compounds where one hydrogen atom has been removed from the ring. As used herein, the term "heterocycle" refers to a cyclic compound that has atoms of at least two different elements as members of its ring.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, t-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); and the abbreviation "Cy" refers to a cyclic alkyl group (cyclobutyl, cyclopentyl, cyclohexyl, etc.).

As used herein the acronym "HCDS" stands for hexachlorodisilane; the acronym "PCDS" stands for pentachlorodisilane; the acronym "OCTS" stands for n-octyltrimethoxysilane; the acronym "TSA" stands for trisilylamine or N$(SiH_3)_3$.

As used herein, the term "iodosilane" means a molecule containing at least one Si—I bond, irrespective of other bonds on the Si or of the molecule backbone. More generally, "halosilane" means a molecule containing at least one Si—X containing bond, wherein X is a halogen atom, irrespective of other bonds on the Si or of the molecule backbone.

As used herein, the term "Si—H containing" means a molecule containing at least one Si—H bond, irrespective of other bonds on the Si or of the molecule backbone.

As used herein, the term "coordinating solvent" means any solvent that donates a pair of electrons, such as solvents containing OH or $NH_3$ groups. Exemplary coordinating solvents include amines, phosphines, ethers, and ketones.

As used herein, the acronym "LCD-TFT" stands for liquid-crystal display-thin-film transistor; the acronym "MIM" stands for Metal-insulator-metal; the acronym "DRAM" stands for dynamic random-access memory; the acronym "FeRAM" stands for Ferroelectric random-access memory; the acronym "sccm" stands for standard cubic centimeter per minute; and the acronym "GCMS" stands for Gas Chromatography-Mass Spectrometry.

The standard abbreviations of the elements from the periodic table of elements are used herein. It should be understood that elements may be referred to by these abbreviations (e.g., Si refers to silicon, N refers to nitrogen, O refers to oxygen, C refers to carbon, etc.).

Any and all ranges recited herein are inclusive of their endpoints (i.e., x=1 to 4 includes x=1, x=4, and x=any number in between), irrespective of whether the term "inclusively" is used.

BRIEF DESCRIPTION OF DRAWINGS

For a further understanding of the nature and objects of the present invention, reference should be made to the following detailed description, taken in conjunction with the accompanying figure wherein.

DETAILED DESCRIPTION

Figure 1:
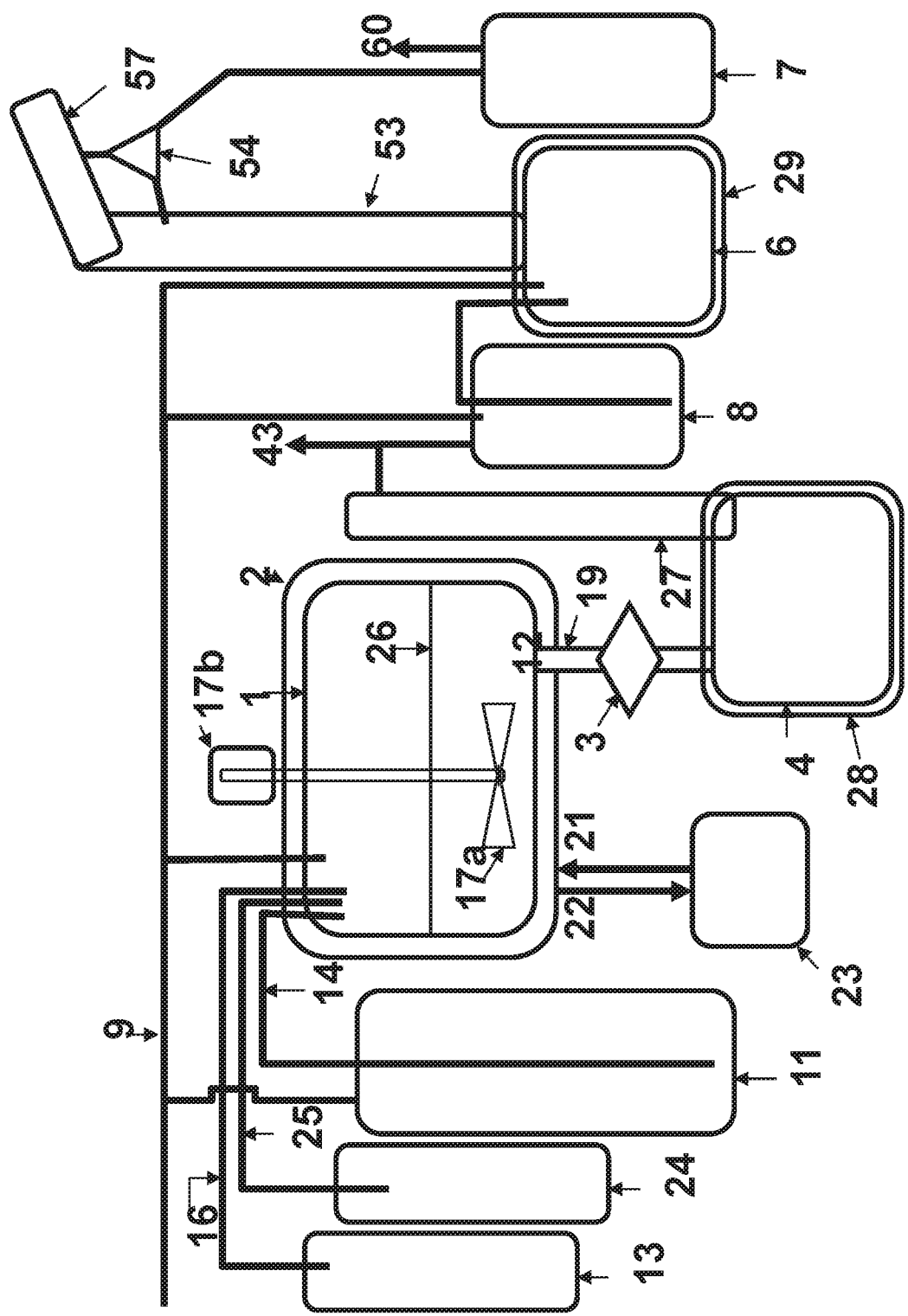
FIG. 1 is a schematic diagram of an apparatus in which the disclosed synthesis methods may be performed.

Disclosed are methods for synthesizing Si—H containing iodosilanes having the formula:

$$Si_wH_xR_yI_z \quad (1)$$

$$N(SiH_aR_bI_c)_3 \quad (2) \text{ or}$$

$$(SiH_mR_nI_o)_2\text{—CH}_2 \quad (3)$$

wherein w is 1 to 3, x+y+z=2w+2, x is 1 to 2w+1, y is 0 to 2w+1, z is 1 to 2w+1, each a is independently 0 to 3, each b is independently 0 to 3, each c is independently 0 to 3, a+b+c=3 provided that at least one a and at least one c is 1, each m is independently 0 to 3, each n is independently 0 to 3, each o is independently 0 to 3, m+n+o=3 provided that at least one m and at least one o is 1, and each R is independently a C1 to C12 hydrocarbyl group, Cl, Br, or a ER'$_3$ group, wherein each E is independently Si or Ge and each R' is independently H or a C1 to C12 hydrocarbyl group.

These compounds, such as diiodosilane (SiH$_2$I$_2$) or pentaiododisilane (Si$_2$HI$_5$), contain highly reactive Si—H groups and, in the case of y or b or n=0, do not have any organic protective groups. As a result, these silicon hydrides are susceptible to nucleophilic attack of the silicon hydride from coordinating solvents. See, e.g., Keinan et al., J. Org. Chem. 1987, 52, 4846-4851 (demonstrating catalytic deoxygenation of alcohols and ethers, carbonyl conjugate addition reactions, and α-alkoxymethylation of ketones by trimethylsilyl iodine). In other words, special care must be taken in selection of an appropriate solvent, when a solvent is used, because the end product may react with solvent. This may lead to product degradation and side reactions. This also limits the selection of solvents that are suitable for the synthesis.

Finkelstein-type S$_N$2 reactions typically rely on the solubility and insolubility of the reagent and salt byproducts, respectively, to act as a driving force in the reaction. For example, trimethylsilyl iodide (TMS-I) may be prepared by reacting trimethylsilyl chloride and an alkali metal iodide salt (see Reaction Scheme 4 above) in a suitable solvent, such as chloroform or acetonitrile. In this particular example, the trimethylsilyl chloride (TMS-Cl) and sodium iodide salts have some solubility in these solvents, whereas the byproduct sodium chloride does not. The precipitation of the byproduct sodium chloride contributes to the driving force of the reaction.

The preparation of Si$_w$H$_x$R$_y$I$_z$ (e.g., SiH$_2$I$_2$ or Si$_2$HI$_5$), N(SiH$_a$R$_b$I$_c$)$_3$ (e.g., N(SiH$_3$)$_2$(SiH$_2$I)), or (SiH$_m$R$_n$I$_o$)$_2$—CH$_2$ (e.g., (SiH$_2$I)—CH$_2$—(SiH$_3$)), may be susceptible to halogen scrambling and side reactions due to the reactivity of the Si—H bond. A coordinating solvent may exacerbate such halogen scrambling and side reactions. The reaction between dichlorosilane (DCS) and lithium iodide produces diiodosilane in the absence of a solvent at ambient temperature (see infra Example 3). Non-coordinating solvents (e.g., n-pentane and chloroform) are helpful during filtration of the lithium chloride salt byproducts. Non-coordinating solvents may also promote the reaction by improved mixing (i.e. dilution of the reaction mass) and suppression of side reaction (heat exchange medium). Suitable non-coordinating solvents include hydrocarbons (such as pentanes, hexanes, cyclohexane, heptanes, octanes, benzene, toluene) and chlorinated aliphatic hydrocarbons (such as chloromethane, dichloromethane, chloroform, carbon tetrachloride, acetonitrile, etc). However, the use of a chlorinated solvent is a less attractive option since these solvents are usually heavily regulated (permits required) and may be carcinogenic. The solvent should be selected to have a sufficient difference in boiling point with the target product, such boiling point difference being typically >20° C., and preferably >40° C.

Exemplary Si—H containing iodosilane reaction products include, but are not limited to:

SiH$_x$I$_{4-x}$, wherein x=1 to 3, such as SiHI$_3$, SiH$_2$I$_2$, or SiH$_3$I;

SiH$_x$R$_y$I$_{x-y}$, wherein x=1 to 2, y=1 to 2, x+y is less than or equal to 3, and each R is independently a C1 to C12 hydrocarbyl group, Cl, Br, or a ER'$_3$ group, wherein each E is independently Si or Ge and each R' is independently H or a C1 to C12 hydrocarbyl group, such as MeSiHI$_2$, MeSiH$_2$I, Me$_2$SiHI, EtSiHI$_2$, EtSiH$_2$I, Et$_2$SiHI, ClSiHI$_2$, ClSiH$_2$I, Cl$_2$SiHI, BrSiHI$_2$, BrSiH$_2$I, BrI$_2$SiHI, H$_3$SiSiHI$_2$, H$_3$SiSiH$_2$I, (H$_3$Si)$_2$SiHI, H$_3$GeSiHI$_2$, H$_3$GeSiH$_2$I, (H$_3$Ge)$_2$SiHI, Me$_3$SiSiHI$_2$, Me$_3$SiSiH$_2$I, (Me$_3$Si)$_2$SiHI, Me$_3$GeSiHI$_2$, Me$_3$GeSiH$_2$I, (Me$_3$Ge)$_2$SiHI, Me$_2$HSiSiHI$_2$, Me$_2$HSiSiH$_2$I, (Me$_2$HSi)$_2$SiHI, Me$_2$HGeSiHI$_2$, Me$_2$HGeSiH$_2$I, (Me$_2$HGe)$_2$SiHI, etc.;

Si$_2$H$_{x-6}$I$_x$, wherein x=1-5, such as Si$_2$HI$_5$, Si$_2$H$_2$I$_4$, Si$_2$H$_3$I$_3$, Si$_2$H$_4$I$_2$, or Si$_2$H$_5$I, with x preferably equal to 5 (i.e., Si$_2$HI$_5$);

Si$_2$H$_x$R$_y$I$_{6-x-y}$, wherein x=1 to 4, y=1 to 4, x+y is less than or equal to 5, and each R is independently a C1 to C12 hydrocarbyl group, Cl, Br, or a ER'$_3$ group, wherein each E is independently Si or Ge and each R' is independently H or a C1 to C12 hydrocarbyl group, such as MeSi$_2$HI$_4$, MeSi$_2$H$_2$I$_3$, MeSi$_2$H$_3$I$_2$, MeSi$_2$H$_4$I, Me$_2$Si$_2$HI$_3$, Me$_2$Si$_2$H$_2$I$_2$, Me$_2$Si$_2$H$_3$I, Me$_3$Si$_2$HI$_2$, Me$_3$Si$_2$H$_2$I, Me$_4$Si$_2$HI, EtSi$_2$HI$_4$, EtSi$_2$H$_2$I$_3$, EtSi$_2$H$_3$I$_2$, EtSi$_2$H$_4$I, Et$_2$Si$_2$HI$_3$, Et$_2$Si$_2$H$_2$I$_2$, Et$_2$Si$_2$H$_3$I, Et$_3$Si$_2$HI$_2$, Et$_3$Si$_2$H$_2$I, Et$_4$Si$_2$HI, ClSi$_2$HI$_4$, ClSi$_2$H$_2$I$_3$, ClSi$_2$H$_3$I$_2$, ClSi$_2$H$_4$I, Cl$_2$Si$_2$HI$_3$, Cl$_2$Si$_2$H$_2$I$_2$, Cl$_2$Si$_2$H$_3$I, Cl$_3$Si$_2$HI$_2$, Cl$_3$Si$_2$H$_2$I, Cl$_4$Si$_2$HI, BrSi$_2$HI$_4$, BrSi$_2$H$_2$I$_3$, BrSi$_2$H$_3$I$_2$, BrSi$_2$H$_4$I, Br$_2$Si$_2$HI$_3$, Br$_2$Si$_2$H$_2$I$_2$, Br$_2$Si$_2$H$_3$I, Br$_3$Si$_2$HI$_2$, Br$_3$Si$_2$H$_2$I, Br$_4$Si$_2$HI, H$_3$SiSi$_2$HI$_4$, H$_3$SiSi$_2$H$_2$I$_3$, H$_3$SiSi$_2$H$_3$I$_2$, H$_3$SiSi$_2$H$_4$I$_1$, (H$_3$Si)$_2$Si$_2$HI$_3$, (H$_3$Si)$_2$Si$_2$H$_2$I$_2$, (H$_3$Si)$_2$Si$_2$H$_3$I, (H$_3$Si)$_3$Si$_2$HI$_2$, (H$_3$Si)$_3$Si$_2$H$_2$I, (H$_3$Si)$_4$Si$_2$HI, H$_3$GeSi$_2$HI$_4$, H$_3$GeSi$_2$H$_2$I$_3$, H$_3$GeSi$_2$H$_3$I$_2$, H$_3$GeSi$_2$H$_4$I, (H$_3$Ge)$_2$Si$_2$HI$_3$, (H$_3$Ge)$_2$Si$_2$H$_2$I$_2$, (H$_3$Ge)$_2$Si$_2$H$_3$I, (H$_3$Ge)$_3$Si$_2$HI$_2$, (H$_3$Ge)$_3$Si$_2$H$_2$I, (H$_3$Ge)$_4$Si$_2$HI, Me$_3$SiSi$_2$HI$_4$, Me$_3$SiSi$_2$H$_2$I$_3$, Me$_3$SiSi$_2$H$_3$I$_2$, Me$_3$SiSi$_2$H$_4$I, (Me$_3$Si)$_2$Si$_2$HI$_3$, (Me$_3$Si)$_2$Si$_2$H$_2$I$_2$, (Me$_3$Si)$_2$Si$_2$H$_3$I, (Me$_3$Si)$_3$Si$_2$HI$_2$, (Me$_3$Si)$_3$Si$_2$H$_2$I, (Me$_3$Si)$_4$Si$_2$HI, Me$_3$GeSi$_2$HI$_4$, Me$_3$GeSi$_2$H$_2$I$_3$, Me$_3$GeSi$_2$H$_3$I$_2$, Me$_3$GeSi$_2$H$_4$I, (Me$_3$Ge)$_2$Si$_2$HI$_3$, (Me$_3$Ge)$_2$Si$_2$H$_2$I$_2$, (Me$_3$Ge)$_2$Si$_2$H$_3$I, (Me$_3$Ge)$_3$Si$_2$H$_2$I, (Me$_3$Ge)$_3$Si$_2$H$_2$I, (Me$_3$Ge)$_3$Si$_2$HI, (Me$_3$Ge)$_4$Si$_2$HI, Me$_2$HSiSi$_2$HI$_4$, Me$_2$HSiSi$_2$H$_2$I$_3$, Me$_2$HSi$_2$H$_3$I$_2$, Me$_2$HSiSi$_2$H$_2$I$_2$, Me$_2$HSiSi$_2$H$_4$I, (Me$_2$HSi)$_2$Si$_2$HI$_3$, (Me$_2$HSi)$_2$Si$_2$H$_2$I$_2$, (Me$_2$HSi)$_2$Si$_2$H$_3$I, (Me$_2$HSi)$_3$Si$_2$HI$_2$, (Me$_2$HSi)$_3$Si$_2$H$_2$I, (Me$_2$HSi)$_4$Si$_2$HI, Me$_2$HGeSi$_2$HI$_4$, Me$_2$HGeSi$_2$H$_2$I$_3$, Me$_2$HGeSi$_2$H$_3$I$_2$, Me$_2$HGeSi$_2$H$_4$I, (Me$_2$HGe)$_2$Si$_2$H$_{13}$, (Me$_2$HGe)$_2$Si$_2$H$_2$I$_2$, (Me$_2$HGe)$_2$Si$_2$H$_3$I, (Me$_2$HGe)$_3$Si$_2$HI$_2$, (Me$_2$HGe)$_3$Si$_2$H$_2$I, (Me$_2$HGe)$_4$Si$_2$HI, etc.;

Si$_3$H$_{x-6}$I$_x$, wherein x=1 to 7, such as Si$_3$H$_7$I, Si$_3$H$_6$I$_2$, Si$_3$H$_5$I$_3$, Si$_3$H$_4$I$_4$, Si$_3$H$_3$I$_5$, Si$_3$H$_2$I$_6$, Si$_3$HI$_7$;

N(SiH$_x$I$_y$)$_3$, wherein each x is independently 0 to 3 and each y is independently 0 to 3, provided that at least one x and at least one y is 1, such as N(SiH$_3$)$_2$(SiH$_2$I), N(SiH$_3$)$_2$(SiHI$_2$), N(SiH$_3$)(SiH$_2$I)$_2$, N(SiH$_3$)(SiHI$_2$)$_2$, N(SiH$_2$I)$_2$(SiHI$_2$), N(SiH$_2$I)(SiHI$_2$)$_2$, N(SiH$_2$I)$_3$, or N(SiHI$_2$)$_3$;

N(SiH$_x$R$_y$I$_z$)$_3$, wherein each x is independently 0 to 3, each y is independently 0 to 3, each z is independently 0 to 3, x+y+z=3, and each R is independently a C1 to C12 hydrocarbyl group, Cl, Br, or a ER'$_3$ group, wherein each E is independently Si or Ge and each R' is independently H or a C1 to C12 hydrocarbyl group, provided that (a) at least one x, at least one y, and at least one z is 1, and (b) that at least one Si is bonded to both H and I, such as N(SiH$_3$)$_2$(SiMeHI), N(SiH$_2$Me)$_2$(SiMeHI), N(SiHMe$_2$)$_2$(SiMeHI), N(SiMe$_2$H)$_2$(SiH$_2$I), N(SiMe$_3$)$_2$(SiH$_2$I), N(SiMe$_2$H)$_2$(SiHI$_2$), N(SiMe$_3$)$_2$(SiHI$_2$), etc.; or (SiH$_x$I$_y$)$_2$CH$_2$, wherein each x is independently 0 to 3, each y is independently 0 to 3, provided that at least one x and at least one y is 1, such as (SiH$_2$I)$_2$—CH$_2$, (SiHI$_2$)$_2$—CH$_2$, (SiH$_2$I)—CH$_2$—(SiH$_3$), (SiHI$_2$)—CH$_2$—(SiH$_3$), or (SiH$_2$I)—CH$_2$—(SiHI$_2$).

The Si—H containing iodosilanes are synthesized by reacting or contacting the corresponding halosilane with an alkali metal halide, as shown:

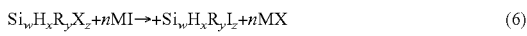

$$\text{Si}_w\text{H}_x\text{R}_y\text{X}_z + n\text{MI} \rightarrow \text{Si}_w\text{H}_x\text{R}_y\text{I}_z + n\text{MX} \quad (6)$$

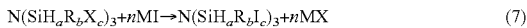

$$\text{N}(\text{SiH}_a\text{R}_b\text{X}_c)_3 + n\text{MI} \rightarrow \text{N}(\text{SiH}_a\text{R}_b\text{I}_c)_3 + n\text{MX} \quad (7)$$

$$(\text{SiH}_m\text{R}_p\text{X}_o)_2\text{—CH}_2 + n\text{MI} \rightarrow (\text{SiH}_m\text{R}_p\text{I}_o)_2\text{—CH}_2 + n\text{MX} \quad (8)$$

wherein w=1 to 3; x=1 to 2w+1; y=0 to 2w+1; z=1 to 2w+1; x+y+z=2w+2; each a is independently 0 to 3; each b is independently 0 to 3; each c is independently 0 to 3; a+b+c=3 provided that at least one a and at least one c is 1; each m is independently 0 to 3; each p is independently 0 to 3; each o is independently 0 to 3; m+p+o=3 provided that at least one m and at least one o is 1; n=1 to 4; X=Br or Cl; M=Li, Na, K, Rb, or Cs, preferably Li; and each R is independently a C1 to C12 hydrocarbyl group, Cl, Br, or a ER'$_3$ group, wherein each E is independently Si or Ge and each R' is independently H or a C1 to C12 hydrocarbyl group. As shown in Example 3, contact between the two reactants may automatically initiate the chemical reaction. Alternatively, depending on the specific reactants, heat and/or mixing may be required to initiate the reaction.

The alkali metal salts (i.e., MI) may be used in excess or in deficient quantities depending on the degree of halogen exchange desired. However, an excess of MI will favor the full substitution of the halide on the halosilane by the iodide, reducing the amount of chlorine or bromine impurities contained in the reaction product. The person having ordinary skill in the art would tune the reaction stoichiometry to make partially iodinated molecules such as SiH$_2$ICl, SiHClI$_2$, Si$_2$HCl$_4$I, SiH$_2$IBr, SiHBrI$_2$, Si$_2$HBr$_4$I, etc.

As discussed above, the salt driven reactions dictate what reagents to use. However, unlike the prior art Finkelstein reactions, lithium iodide and lithium chloride exhibit little to no solubility in hydrocarbons or fluorocarbons. For example, the reaction of SiCl$_2$H$_2$ with two moles of lithium iodide in an aliphatic, aromatic, or chlorinated hydrocarbon will form SiI$_2$H$_2$ and two moles of lithium chloride as the main product and salt byproduct, respectively. Both LiI and LiCl remain as solids during this reaction. Li and Cl form a hard acid/base pair. Li and I have a hard/soft acid/base mismatch. As a result, Applicants believe that formation of the insoluble LiCl may provide the driving force for the reaction. However, the formation of SiH$_2$I$_2$ itself may partially solubilize LiI and help drive the reaction. As a result, it may be beneficial to add the desired Si—H containing iodosilane product to the original reaction mixture.

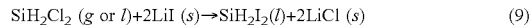

$$\text{SiH}_2\text{Cl}_2 \, (g \text{ or } l) + 2\text{LiI} \, (s) \rightarrow \text{SiH}_2\text{I}_2(l) + 2\text{LiCl} \, (s) \quad (9)$$

with g=gas, l=liquid, and s=solid. Other alkali metal salts, such as sodium iodide (NaI) are useful in some cases for the preparation of halogen exchange products. However, NaI is less reactive than LiI in a comparable solvent and would typically require a coordinating solvent for any reaction to proceed at industrially relevant reaction rates, provided that the coordinating solvent is selected to minimize adverse impact on product synthesis and/or yield.

In another example, the reaction of Si$_2$Cl$_5$H with five moles of sodium iodide in a chlorinated hydrocarbon, such as chloroform, will form Si$_2$I$_5$H and five moles of sodium chloride as the main product and salt byproduct, respectively. Formation of NaCl is the driving force for the reaction.

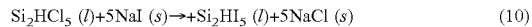

$$\text{Si}_2\text{HCl}_5 \, (l) + 5\text{NaI} \, (s) \rightarrow \text{Si}_2\text{HI}_5 \, (l) + 5\text{NaCl} \, (s) \quad (10)$$

One of ordinary skill in the art will recognize that competition between the Si—Si bond cleavage and halogen exchange may require the use of the less reactive NaI or an alternative alkali metal halide, and/or alternative solvents. Product yield may be further maximized by optimizing reaction parameters, such as removing any salt byproducts as the reaction proceeds to further prevent halogen scrambling and side reactions.

While the examples that follow demonstrate the disclosed synthesis processes using inorganic halosilane reactants, one of ordinary skill in the art will recognize that organic Si—R groups are less reactive than Si—X and Si—H and therefore are likely to remain undisturbed during the disclosed synthesis processes.

The halosilane and alkali metal halide reactants may be commercially available. Alternatively, the halosilane reactant may be synthesized by reducing the corresponding fully halogenated silane (i.e., Si$_x$R$_y$X$_{2x+2-y}$, N(SiR$_b$X$_{3-b}$)$_3$, or (SiR$_n$X$_{3-n}$)$_2$—CH$_2$) with a standard reducing agent such as Lithium Aluminum Hydride (e.g., LiAlH$_4$), NaBH$_4$, etc. In another alternative, the halosilane reactant may be synthesized by reacting the corresponding silane [i.e., Si$_x$R$_y$H$_{2x+2-y}$, N(SiH$_a$R$_{3-a}$)$_3$, or (SiH$_m$R$_{3-m}$)$_2$—CH$_2$] with a halogenating agent, such as N-chloro, -bromo, or -iodo-succinimide in toluene for 1 to 12 hours at temperatures ranging from 0° C. to reflux, according to Morrison et al., J. Organomet. Chem., 92, 2, 1975, 163-168. While the form of the reactants is not critical (i.e., solid, liquid, or gas), one of ordinary skill in the art will recognize that reactants having a larger surface area provide more reaction sites and therefore more efficient reactions. For example, a finer grain powder typically provides more reaction sites than solid beads or chunks.

The water content of the reactants and any solvents should be minimized to prevent formation of siloxane by-products (i.e., Si—O—Si). Preferably, the water content ranges from approximately 0% w/w to approximately 0.001% w/w (10 ppmw). If necessary, the reactants may be dried prior to synthesis using standard techniques, such as refluxing over $P_2O_5$, treating by molecular sieve, or heating under vacuum (e.g., anhydrous LiI may be produced by baking at 325° C. under vacuum for 8+ hours).

The reaction vessel is made of, lined with, or treated to be a material that is compatible with the reactants and products. Exemplary materials include passivated stainless steel, glass, perfluoroalkoxy alkanes (PFA), and polytetrafluoroethylene (PTFE). The vessel may be jacketed or placed in a heating or cooling bath. The reaction vessel may include a stirring mechanism made of a compatible material, such as glass stirring shafts, PTFE paddle stirrers, and/or PTFE coated stainless steel impellers. The reaction vessel may also be equipped with multiple "injection ports," pressure gauges, diaphragm valves. The reaction vessel is designed to perform the synthesis under an inert atmosphere, such as $N_2$ or a noble gas. Precautions to minimize the exposure of the reactants and reaction mixture to light may also be taken, such as covering any clear glassware in tin foil. For synthesis of $SiH_2I_2$, amber colored glassware is not suitable because the iron oxide coating may contaminate the product. Additionally, the reaction vessel, stirring mechanism, and any other associated equipment, such as a Schlenk line or glovebox, should be air- and moisture-free using standard drying techniques, such as vacuum, inert gas flow, oven drying, etc.

As discussed above with respect to the reactants and demonstrated in the examples that follow, the reaction vessel and any and all components that come into contact with the reactants and products should have high purity. A high purity reaction vessel is typically a vessel that is compatible with the Si—H containing iodosilane. The high purity reaction vessel is free of impurities that may react with or contaminate the Si—H containing iodosilane. Typical examples of such high purity vessels are stainless steel canisters, having low surface roughness and mirror finish. The low surface roughness and mirror finish is typically obtained by mechanical polishing and optionally by additional electropolishing. The high purity is typically obtained by treatments that include (a) cleaning steps using dilute acids (HF, $HNO_3$), followed by (b) a rinsing with high purity deionized water to ensure the complete removal of traces of the acid, followed by (c) drying of the vessel. The deionized water (DIW) rinsing is typically carried out until the resistivity of the rinsing water reaches 100 µS/cm, and preferably below 25 µS/cm. The drying step may comprise purge steps using an inert gas such as He, $N_2$, Ar, (preferably $N_2$ or Ar), vacuum steps during which the pressure in the vessel is reduced to accelerate outgassing from the surface, heating of the vessel, or any combination thereof.

The gas used for the purging should be of semiconductor grade, i.e. free of contaminants such as trace moisture and oxygen (<1 ppm, preferably <10 ppb), and particles (<5 particles per litre @ 0.5 µm). The drying step may comprise alternate sequences of purges, during which a certain flow of gas is flown through the vessel, and vacuuming steps. Alternatively, the drying step may be carried out by constantly flowing a purge gas while maintaining a low pressure in the vessel. The efficiency and end point of the canister drying can be assessed by measuring the trace $H_2O$ level in the gas emerging from the vessel. With an inlet gas having less than 10 ppb $H_2O$, the outlet gas should have a moisture content ranging from approximately 0 ppm to approximately 10 ppm, preferably ranging from approximately 0 ppm to approximately 1 ppm, and more preferably ranging from approximately 0 ppb to approximately 200 ppb. During the purge steps and vacuum steps, heating the vessel is known to accelerate the drying time. Vessels are typically maintained at a temperature ranging from approximately 40° C. to approximately 150° C. during drying.

Once cleaned and dried, such high purity vessels must have a total leak rate below 1E-6 std cm3/s, preferably <1E-8 std cm3/s.

Optionally, the vessel may have internal coatings or platings to further reduce the risk of corrosion of or improve the stability of the product in the vessel. Exemplary coatings include those provided by Silcotek (https://www.silcotek.com) or disclosed in U.S. Pat. App. Pub. No. 2016/046408. The vessel may also be passivated by exposure to a silylating agent such as silane, disilane, monochlorosilane, hexamethyldisilazane prior to the reaction and/or filling with the Si—H containing iodosilane.

One of ordinary skill in the art will recognize the sources for the equipment components of the systems used to practice the disclosed methods. Some level of customization of the components may be required based upon the desired temperature range, pressure range, local regulations, etc. Exemplary equipment suppliers include Buchi Glass Uster AG, Shandong ChemSta Machinery Manufacturing Co. Ltd., Jiangsu Shajiabang Chemical Equipment Co. Ltd, etc. As discussed above, the components are preferably made of corrosion resistant materials, such as glass, glass-lined steel, or steel with corrosion resistant liners, etc.

The air- and moisture-free high purity reactor is charged with the alkali metal halide. Prior to or after addition of the alkali metal halide to the reactor, an optional solvent that does not decompose or react with the final product may be added as a heat exchange medium and/or an aid in mixing and/or product extraction. Exemplary solvents include C3-C20 alkanes (such as propane, butane, pentane, etc.) or chlorinated hydrocarbons (such as chloromethane, dichloromethane, chloroform, carbon tetrachloride, etc.), and mixtures thereof. As discussed above, the desired Si—H containing iodosilane may also be used as a solvent. The alkali metal halide salt may be soluble in the solvent. However, depending on the reactants, salt solubility may not be a critical factor. For example, as shown in Example 5 infra, the solid lithium iodide in pentane reacts with the liquid dichlorosilane in a solid-liquid reaction. The reaction mixture may be stirred to further promote the contact between the reactants. Alternatively, the reaction may proceed without the use of a solvent, as illustrated in Example 3 infra.

The halosilane may be added to the reactor through the headspace or via subsurface addition as a gas, liquid (condensed), or in a solution. The halosilane may be in gas form and added to the headspace above the lithium iodide/solvent mixture. Alternatively, the gas form of the halosilane may condensed using a condenser and added directly to the lithium iodide/solvent mixture. In another alternative, the liquid form of the halosilane may be added from the top of the reactor using a conduit piped to the reactor. In another alternative, the gaseous or liquid form may be added below the surface of the iodine/solvent mixture using a reactor equipped with a dip tube plunged inside the salt/solvent mixture. In the examples that follow, condensation of dichlorosilane was done to facilitate a more rapid reagent transfer.

The halosilane may be added in excess, stoichiometric, or sub-stoichiometric amounts, depending upon which product distribution is desired. An excess amount of halosilane versus the metal iodide salt will lead to a partial substitution of the halides by iodine on the halosilane, and allow the formation of $Si_wH_xR_yI_z$ compounds, wherein at least one R is Cl or Br. An excess of the iodide metal salt will favor the full substitution of the iodide on the halosilane (i.e., no R=Cl or Br).

Alternatively, the halosilane may be added to the reactor prior to the addition of the alkali metal halide. The addition mechanisms for the halosilane and alkali metal halide described above remain the same whether the reactant is added to the reactor first or second.

The halosilane/alkali metal halide combination may be stirred to further promote contact between the reactants. The reaction may be exothermic. In the examples that follow, the reaction mixture is stirred for a sufficient time to permit the reaction to move to completion at ambient temperature (i.e., approximately 20° C. to approximately 26° C.). No heating was necessary in the following examples, but may be an option to accelerate the reaction. A person of ordinary skill in the art may determine the most suitable temperature range depending on the individual kinetics of each halosilane. For example, a halosilane having partial hydrocarbyl substitutions may require a higher reaction temperature than a halosilane having no hydrocarbyl substituents because of the steric hindrance produced by the hydrocarbyl groups.

The progress of the reaction may be monitored using, for example, gas chromatography or in-situ probes such as FTIR or RAMAN probes, which are commercially available. For a stoichiometric excess of the metal iodide salt, the predominant reaction products are $Si_wH_xR_yI_z$+nMX, with minor amounts of $Si_wH_xR_yX_z$, MI, solvent, and a $Si_wH_xR_y(IX)_z$ intermediary reaction product, containing z amount of both I and X. For example, the $SiH_2I_2$ reaction mixture may include the $SiH_2I_2$ reaction product, the LiCl reaction byproduct, some residual $SiCl_2H_2$ and/or LiI reactants, solvent, and the $ClSiH_2I$ intermediary reaction product.

The Si—H containing iodosilane may be isolated from the reaction mixture by filtration and distillation. Any solid impurities and the salt byproduct may be filtered from the reaction mixture. Typical filters include glass or polymer fritted filters.

Alternatively, when the salt byproduct dissolves in the solvent, the mixture may be filtered to remove solid byproducts prior to further isolation processes. A filtration agent such as anhydrous diatomaceous earth may be employed to improve the process. Typical filters include glass or polymer frit filters.

Occasionally, further processing may be needed to isolate the Si—H containing iodosilane. For example, when the filtrate yields a heterogeneous suspension of solid material, the filtrate may then be distilled over a short path column to isolate the Si—H containing iodosilane through a flash distillation process that removes some or all of the non-desired reaction byproducts or impurities. Alternatively, the Si—H containing iodosilane reaction product may be isolated from the filtrate through a distillation column or by heating the filtrate to approximately the boiling point of the non-organic silicon hydride reaction product. In another alternative, both the flash process and the distillation column may be necessary. One of ordinary skill in the art will recognize that the boiling point of the warmed mixture will change as the Si—H containing iodosilane reaction product is isolated from the warmed mixture and adjust the recovery temperature accordingly. Any unreacted halosilane may be vented through a distillation column as it tends to be more volatile than the product obtained, owing to the high mass of iodine vs Br or Cl. One of ordinary skill in the art will recognize that the vented halosilane may be recovered for later use or disposal.

The disclosed methods may convert approximately 40% mol/mol to approximately 99% mol/mol of the halosilane reactant to the Si—H containing iodosilane reaction product. The isolated Si—H containing iodosilane reaction product has a purity typically ranging from approximately 50% mol/mol to approximately 99% mol/mol.

The Si—H containing iodosilane reaction product may be further purified by distillation, sublimation, or re-crystallization. Suitable distillation methods include atmospheric fractional distillation, batch fractional distillation, or vacuum fractional distillation. The batch fractional distillation may be performed at low temperature and pressure. Alternatively, the Si—H containing iodosilane reaction product may be purified by continuous distillation over two distillation columns to separate the Si—H containing iodosilane reaction product from both low and high boiling impurities in sequential steps. The purified Si—H containing iodosilane reaction products may be used as Si-containing film forming compositions.

The Si-containing film forming composition has a purity ranging from approximately 97% mol/mol to approximately 100% mol/mol, preferably from approximately 99% mol/mol to approximately 100% mol/mol, more preferably from approximately 99.5% mol/mol to approximately 100% mol/mol, and even more preferably from approximately 99.97% mol/mol to approximately 100% mol/mol.

The Si-containing film forming compositions preferably comprise between the detection limit and 100 ppbw of each potential metal contaminant (e.g., at least Ag, Al, Au, Ca, Cr, Cu, Fe, Mg, Mo, Ni, K, Na, Sb, Ti, Zn, etc.). More particularly, as shown in Example 11, Si-containing film forming compositions synthesized according the disclosed methods do not require the use of any Sb, Ag, or Cu powder/pellet stabilizers. As a result, the Si-containing film forming composition contains between approximately 0 ppbw and approximately 100 ppbw Cu, preferably between approximately 0 ppbw and 50 ppbw, and more preferably between approximately 0 ppbw and 10 ppb. The ability to synthesize Si-containing film forming compositions that do not require Cu stabilizers is beneficial because any Cu contamination may adversely affect the electrical properties of the resulting Si-containing film. The Si-containing film forming composition also contains between approximately 0 ppbw and approximately 100 ppbw Sb, preferably between approximately 0 ppbw and 50 ppbw, and more preferably between approximately 0 ppbw and 10 ppb. The Si-containing film forming composition contains between approximately 0 ppbw and approximately 100 ppbw Ag, preferably between approximately 0 ppbw and 50 ppbw, and more preferably between approximately 0 ppbw and 10 ppb.

The concentration of X (wherein X=Cl, Br, or I) in the Si-containing film forming compositions may range from approximately 0 ppmw to approximately 100 ppmw, and more preferably from approximately 0 ppmw and to approximately 10 ppmw.

When y or b or n=0 (i.e., the Si-containing film forming compositions do not have any organic protective groups), the Si-containing film forming compositions comprise between approximately 0 ppmw and approximately 100 ppmw C. Depending upon the type of Si-containing film being deposited, carbon incorporation may be highly undesired because small amounts of C in the film result in large changes in film properties. Film properties that may be strongly affected by small levels of C incorporation include wet etch rate, leakage current, film stress, and/or Young's modulus. As a result, controlling the amount of C in the Si-containing film is desirable. Synthesizing a Si-containing film forming composition that is C free provides more flexibility in engineering the desired Si-containing film composition. Alternative synthetic methods that utilize organic ligands have a much higher probability of containing C impurities in the final product, irrespective of the purification steps performed following the synthesis reaction. The methods disclosed herein do not use any organic ligands when y or b or n=0 and therefore avoid this potential contamination source, providing high reliability and similarity of product from run to run.

As shown in the examples below, the purified product may be analyzed by gas chromatography mass spectrometry (GCMS). The structure of the product may be confirmed by $^1$H, $^{13}$C and/or $^{29}$Si NMR.

As discussed in detail above and illustrated in the examples that follow, the Si-containing film forming composition must be stored in a clean dry storage vessel with which it does not react in order to maintain its purity.

FIG. 1 is an exemplary system suitable to perform the disclosed methods. Air may be removed from various parts of the system (e.g., reactor 1, vessel 8, boiler 6) by an inert gas 9 (e.g., nitrogen, argon, etc.). The inert gas 9 may also serve to pressurize optional solvent vessel 11 to permit solvent delivery to reactor 1. Nitrogen, refrigerated ethanol, an acetone/dry ice mixture, or heat transfer agents such as monoethylene glycol (MEG) may be used to cool various parts of the system (e.g., reactor 1, distillation column 27, condenser 57).

The reactor 1 may be maintained at the desired temperature by jacket 2. The jacket 2 has an inlet 21 and an outlet 22. Inlet 21 and outlet 22 may be connected to a heat exchanger/chiller 23 and/or pump (not shown) to provide recirculation of the cooling fluid. Alternatively, if the batch size is small enough and the mixing time short enough, jacket 2 may not require inlet 21 and outlet 22 because the thermal fluid may be sufficiently cold for the duration of the reaction. In another alternative, and as discussed above, jacketed temperature control may not be necessary and these four components removed from the system (i.e., 2, 21, 22 and 23).

The reactants [optional solvent (such as pentane) stored in solvent vessel 11 and halosilane (such as ethyldichlorosilane) stored in halosilane vessel 24] are added to reactor 1 via optional solvent line 14 and halosilane line 25, respectively. The optional solvent and halosilane may be added to the reactor 1 via a liquid metering pump (not shown), such as a diaphragm pump, peristaltic pump, or syringe pump. The alkali metal halide (such as LiI), stored in alkali metal halide vessel 13, may be added to the reactor 1 via gravity flow or suspended in a solvent compatible with the Si—H containing iodosilane reaction product and introduced into the reactor in a manner analogous to that of the solvent and halosilane (i.e., via alkali metal halide line 16). The contact between the reactants may be further promoted by mixing with an impeller 17a turned by motor 17b to form mixture 26. Preferably, the mixing is performed under an inert atmosphere at approximately atmospheric pressure. A temperature sensor (not shown) may be used to monitor the temperature of the contents of the reactor 1.

Upon completion of the addition, the progress of the reaction may be monitored using, for example, gas chromatography. Upon completion of the reaction, the mixture 26 may be removed from reactor 1 via drain 19 through filter 3 to still pot container 4. The predominant reaction products are ethyldiiodosilane (EtSiHI$_2$—a liquid at standard temperature and pressure) and LiCl (a solid at standard temperature and pressure), with minor amounts of LiI and EtSiClH impurities. As a result, filtration isolates the liquid ethyldiiodosilane product from the LiCl reaction byproduct. In this embodiment, reactor 1 will most likely be located above filter 3 to best use the benefits of gravity. As the MX reaction byproduct (X=Cl, Br), for example LiCl, (not shown) is suspended in the mixture 26, clogging of the reactor 1 is not a problem.

The filtered stirred mixture (filtrate)(not shown) may be collected in containers (not shown) and transported to a new location prior to performance of the next process steps. Alternatively, the filtrate may immediately be directed to a still pot container 4 to further isolate the reaction product from any solvent or other impurities using heater 28. The filtrate is warmed by heater 28. The heat forces any volatile solvent through distillation column 27 and vent 43. Subsequently, the isolated reaction product is collected in vessel 8.

Once again, vessel 8 may be transported to a new location prior to performance of the next process steps. The isolated reaction product may be transferred from vessel 8 to boiler 6 for further purification, if necessary. Boiler 6 is heated by heater 29. The isolated reaction product is purified by fractional distillation using distillation tower 53, condenser 57, and reflux divider 54. The purified reaction product is collected in collection tank 7. Collection tank 7 includes vent 60.

Figure 2:
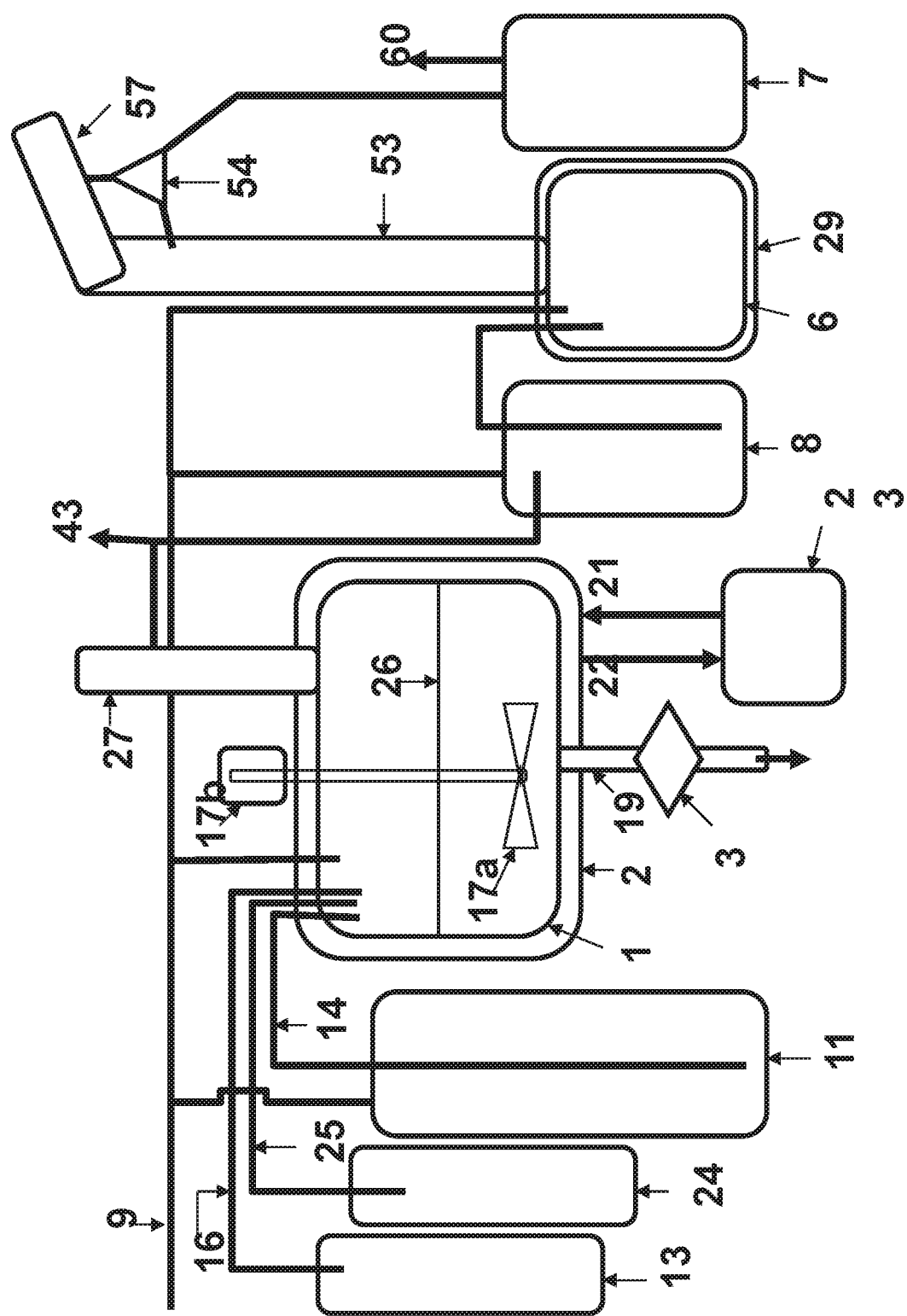
FIG. 2 is a schematic diagram of an alternative apparatus in which the disclosed synthesis methods may be performed.

FIG. 2 is an alternate exemplary system suitable to perform the disclosed methods. In this alternative, reactor 1 also serves as the still pot container 4 of FIG. 1. This embodiment may be useful for synthesis of large batches of Si—H containing iodosilanes. After sufficient mixing, the cooling medium (not shown) in jacket 2 is replaced by a heating medium (not shown). One of ordinary skill in the art will recognize that "replacement" of the cooling medium will not be necessary if the cooling medium is also capable of acting as both a heating and cooling medium (e.g., MEG). Instead, the temperature of the medium may be changed via, for example, heat exchanger 23.

The volatile solvent may be separated from the mixture 26 through distillation column 27 and vent 43. Subsequently, Si—H containing iodosilane is isolated in vessel 8. The remaining solvent/salt mixture may be removed from reactor 1 via drain 19 with the salt collected on filter 3. Once again, vessel 8 may be transported to a new location prior to performance of the next process steps. The Si—H containing iodosilane may be transferred from vessel 8 to boiler 6 for further purification, if necessary. Boiler 6 is heated by heater 29. The Si—H containing iodosilane is purified by fractional distillation using distillation tower 53, condenser 57, and reflux divider 54. The purified Si—H containing iodosilane is collected in collection tank 7. Collection tank 7 includes vent 60.

In another alternative, the reaction may be performed in a continuous reactor by passing the halosilane reactant (in gas or liquid form or diluted in a solvent) and the alkali metal iodide reactant (possibly suspended in a solvent) through a flow through reactor at a controlled residence time and temperatures. The flow of each reagent may be controlled by metering pumps such as peristaltic pumps. The reaction mixture may be collected in a receiving vessel and the Si—H containing iodosilane isolated as in the batch synthesis example above. Alternatively, the solid fraction may be removed in line, using for instance a centrifuge pump (commercially available). In another alternative, the Si—H containing iodosilane product may be isolated from any solvent(s) by continuously feeding the filtered fraction to a continuous distillation unit.

The advantages of the disclosed synthesis methods are as follows:

A catalyst free process, which helps reduce cost, contamination and product isolation issues;

Essentially eliminates a majority of side reactions associated with the prior art reaction using an iodine reactant, which forms lower and higher-order iodosilanes as impurities;

Does not produce a HX intermediary reaction product, which may contribute to side reactions and increased impurity profile and, as a result, the resulting product does not require the prior art Ag, Cu or Sb stabilizer;

When y or b or n=0, no carbon containing impurities are produced, which may negatively affect the properties of the resulting Si-containing film;

Many of the starting materials are inexpensive and readily available;

One step-one pot reactions;

The process may be solventless;

Simple purification;

Low reaction exotherm;

May be performed at ambient temperature (i.e., approximately 20° C. to approximately 26° C.); and The waste generation is minimal and environmentally benign.

All of the above are advantageous from the standpoint of developing a scalable industrial process. Additionally, the resulting product is more stable than products made using $X_2$ or HX reactants. As a result, the reaction product maintains purity levels suitable for the semiconductor industry without the use of stabilizers, such as Cu, which may adversely affect the electrical properties of the deposited films.

Also disclosed are methods of using the disclosed Si-containing film forming compositions for vapor deposition methods. The disclosed methods provide for the use of the Si-containing film forming compositions for deposition of silicon-containing films. The disclosed methods may be useful in the manufacture of semiconductor, photovoltaic, LCD-TFT, or flat panel type devices. The method includes: introducing the vapor of the disclosed Si-containing film forming compositions into a reactor having a substrate disposed therein and depositing at least part of the disclosed Si—H containing iodosilane onto the substrate via a deposition process to form a Si-containing layer.

The disclosed methods also provide for forming a bimetal-containing layer on a substrate using a vapor deposition process and, more particularly, for deposition of $SiMO_x$ or $SiMN_x$ films, wherein x may be 0-4 and M is Ta, Nb, V, Hf, Zr, Ti, Al, B, C, P, As, Ge, lanthanides (such as Er), or combinations thereof.

The disclosed methods of forming silicon-containing layers on substrates may be useful in the manufacture of semiconductor, photovoltaic, LCD-TFT, or flat panel type devices. The disclosed Si—H containing iodosilanes may deposit Si-containing films using any vapor deposition methods known in the art. Examples of suitable vapor deposition methods include chemical vapor deposition (CVD) or atomic layer deposition (ALD). Exemplary CVD methods include thermal CVD, plasma enhanced CVD (PECVD), pulsed CVD (PCVD), low pressure CVD (LPCVD), sub-atmospheric CVD (SACVD) or atmospheric pressure CVD (APCVD), flowable CVD (f-CVD), metal organic chemical vapor deposition (MOCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, spatial ALD, or PE-ALD in order to provide suitable step coverage and film thickness control.

The vapor of the Si-containing film forming composition is introduced into a reaction chamber containing a substrate. The temperature and the pressure within the reaction chamber and the temperature of the substrate are held at conditions suitable for vapor deposition of at least part of the Si—H containing iodosilane onto the substrate. In other words, after introduction of the vaporized composition into the chamber, conditions within the chamber are such that at least part of the vaporized precursor deposits onto the substrate to form the silicon-containing film. A co-reactant may also be used to help in formation of the Si-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD reaction chamber. The reaction chamber may be maintained at a pressure ranging from about 0.5 mTorr to about 760 Torr. In addition, the temperature within the reaction chamber may range from about 20° C. to about 700° C. One of ordinary skill in the art will recognize that the temperature may be optimized through mere experimentation to achieve the desired result.

The temperature of the reactor may be controlled by either controlling the temperature of the substrate holder and/or controlling the temperature of the reactor wall. Devices used to heat the substrate are known in the art. The reactor wall may be heated to a sufficient temperature to obtain the desired film at a sufficient growth rate and with desired physical state and composition. A non-limiting exemplary temperature range to which the reactor wall may be heated includes from approximately 20° C. to approximately 700° C. When a plasma deposition process is utilized, the deposition temperature may range from approximately 20° C. to approximately 550° C. Alternatively, when a thermal process is performed, the deposition temperature may range from approximately 300° C. to approximately 700° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 150° C. to 700° C. Preferably, the temperature of the substrate remains less than or equal to 500° C.

The type of substrate upon which the silicon-containing film will be deposited will vary depending on the final use intended. A substrate is generally defined as the material on which a process is conducted. The substrates include, but are not limited to, any suitable substrate used in semiconductor, photovoltaic, flat panel, or LCD-TFT device manufacturing. Examples of suitable substrates include wafers, such as silicon, silica, glass, Ge, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (Si-COH) layers, or combinations thereof. Additionally, the wafers may include copper layers, tungsten layers or metal layers (e.g. platinum, palladium, nickel, rhodium, or gold). The wafers may include barrier layers, such as manganese, manganese oxide, tantalum, tantalum nitride, etc. The layers may be planar or patterned. In some embodiments, the substrate may be coated with a patterned photoresist film. In some embodiments, the substrate may include layers of oxides which are used as dielectric materials in MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN) that are used as electromigration barrier and adhesion layer between copper and the low-k layer. The disclosed processes may deposit the silicon-containing layer directly on the wafer or directly on one or more than one (when patterned layers form the substrate) of the layers on top of the wafer. Furthermore, one of ordinary skill in the art will recognize that the terms "film" or "layer" used herein refers to a thickness of some material laid on or spread over a surface and that the surface may be a trench or a line. Throughout the specification and claims, the wafer and any associated layers thereon are referred to as substrates. The actual substrate utilized may also depend upon the specific precursor embodiment utilized. In many instances though, the preferred substrate utilized will be selected from hydrogenated carbon, TiN, SRO, Ru, and Si type substrates, such as polysilicon or crystalline silicon substrates.

The substrate may be patterned to include vias or trenches having high aspect ratios. For example, a conformal Si-containing film, such as SiN or $SiO_2$, may be deposited using any ALD technique on a through silicon via (TSV) having an aspect ratio ranging from approximately 20:1 to approximately 100:1.

The Si-containing film forming compositions may be supplied neat. Alternatively, the Si-containing film forming compositions may further comprise a solvent suitable for use in vapor deposition. The solvent may be selected from, among others, $C_1$-$C_{16}$ saturated or unsaturated hydrocarbons.

For vapor deposition, the Si-containing film forming compositions are introduced into a reactor in vapor form by conventional means, such as tubing and/or flow meters. The vapor form may be produced by vaporizing the Si-containing film forming compositions through a conventional vaporization step such as direct liquid injection, direct vapor draw in the absence of a carrier gas, by bubbling a carrier gas through the liquid, or by evaporating vapors in a carrier gas without bubbling through the liquid. When the precursor is solid at room temperature, a sublimator may be used, such as the one disclosed in PCT Publication WO2009/087609 to Xu et al. The Si-containing film forming compositions may be fed in liquid state to a vaporizer (Direct Liquid Injection) where it is vaporized and mixed with a carrier gas before it is introduced into the reactor. Alternatively, the Si-containing film forming compositions may be vaporized by passing a carrier gas into a container containing the composition or by bubbling the carrier gas into the composition. The carrier gas may include, but is not limited to, Ar, He, or $N_2$, and mixtures thereof. The carrier gas and composition are then introduced into the reactor as a vapor.

Figure 3:
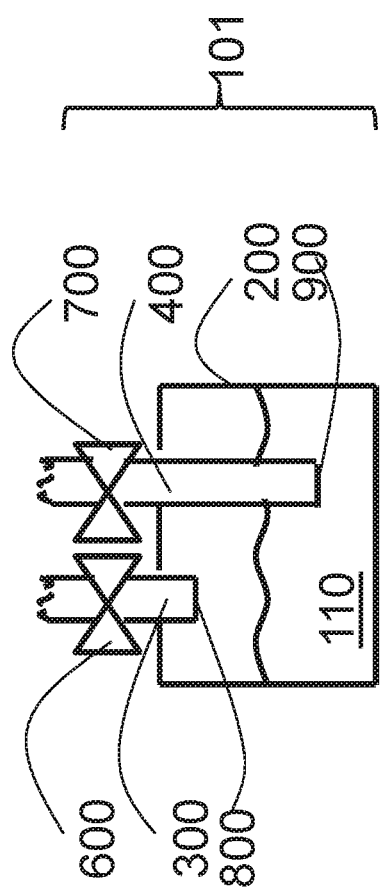
FIG. 3 is a side cross-section view of one embodiment of the Si-containing film forming composition delivery device 1.
Figure 4:
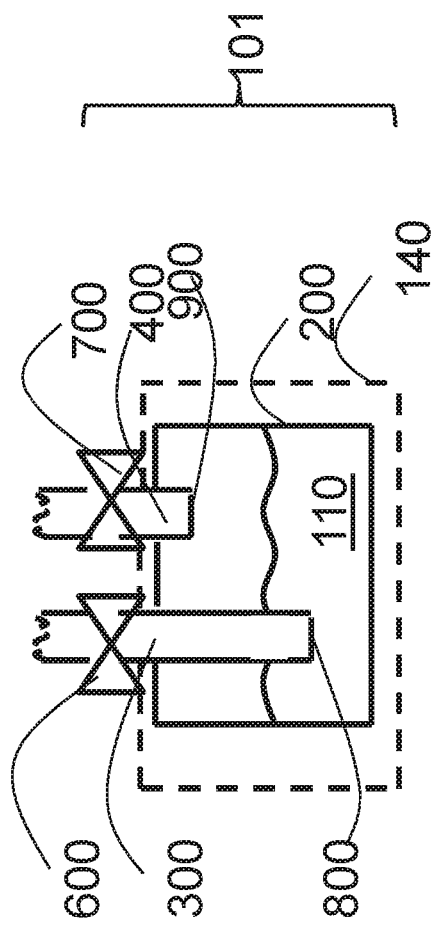
FIG. 4 is a side cross-section view of a second embodiment of the Si-containing film forming composition delivery device 1.
Figure 5:
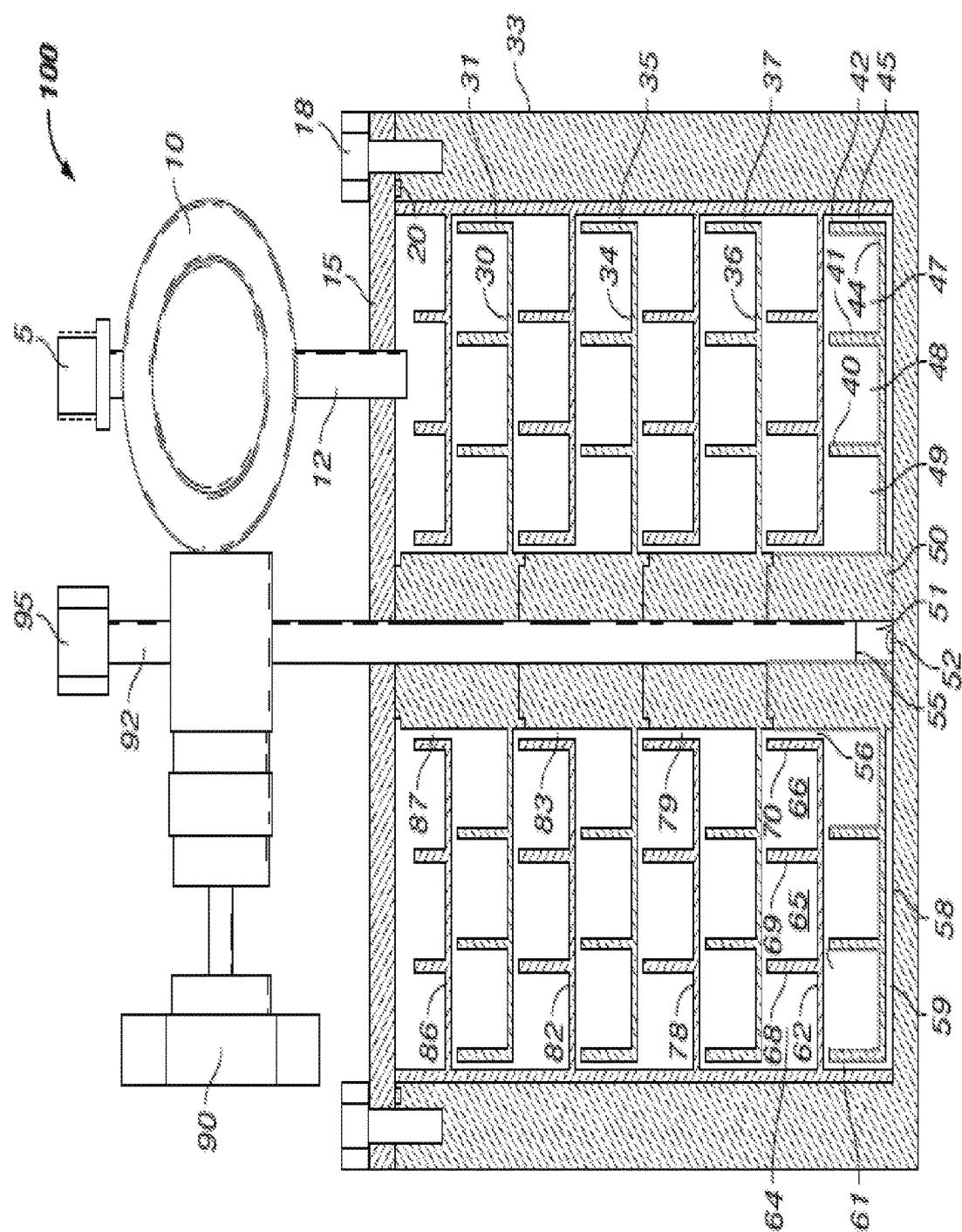
FIG. 5 is a side cross-section view of an exemplary embodiment of a solid precursor sublimator 100 for subliming solid Si-containing film forming compositions.

The Si-containing film forming compositions may be delivered to the reactor or vapor deposition chamber by the Si-containing film forming composition delivery devices of FIGS. 3-5. FIGS. 3-5 show three exemplary embodiments of Si-containing film forming composition delivery devices. As discussed in detail above and illustrated in the examples that follow, the delivery devices must be clean and dry and made of a material with which the Si-containing film forming composition does not react.

FIG. 3 is a side view of one embodiment of the Si-containing film forming composition delivery device 101. In FIG. 3, the disclosed Si-containing film forming compositions 110 are contained within a container 200 having two conduits, an inlet conduit 300 and an outlet conduit 400. One of ordinary skill in the art will recognize that the container 200, inlet conduit 300, and outlet conduit 400 are manufactured to prevent the escape of the gaseous form of the Si-containing film forming composition 110, even at elevated temperature and pressure.

The outlet conduit 400 of the delivery device 101 fluidly connects to the reactor (not shown) or other components between the delivery device and the reactor, such as a gas cabinet, via valve 700. Preferably, the container 200, inlet conduit 300, valve 600, outlet conduit 400, and valve 700 are made of passivated 316L EP or 304 passivated stainless steel. However, one of ordinary skill in the art will recognize that other non-reactive materials may also be used in the teachings herein.

In FIG. 3, the end 800 of inlet conduit 300 is located above the surface of the Si-containing film forming composition 110, whereas the end 900 of the outlet conduit 400 is located below the surface of the Si-containing film forming composition 110. In this embodiment, the Si-containing film forming composition 110 is preferably in liquid form. An inert gas, including but not limited to nitrogen, argon, helium, and mixtures thereof, may be introduced into the inlet conduit 300. The inert gas pressurizes the container 200 so that the liquid Si-containing film forming composition 110 is forced through the outlet conduit 400 and to the reactor (not shown). The reactor may include a vaporizer which transforms the liquid Si-containing film forming composition 110 into a vapor, with or without the use of a carrier gas such as helium, argon, nitrogen or mixtures thereof, in order to deliver the vapor to the substrate on which the film will be formed. Alternatively, the liquid Si-containing film forming composition 110 may be delivered directly to the wafer surface as a jet or aerosol.

FIG. 4 is a side view of a second embodiment of the Si-containing film forming composition delivery device 101. In FIG. 4, the end 800 of inlet conduit 300 is located below the surface of the Si-containing film forming composition 110, whereas the end 900 of the outlet conduit 400 is located above the surface of the Si-containing film forming composition 110. FIG. 4 also includes an optional heating element 140, which may increase the temperature of the Si-containing film forming composition 110. In this embodiment, the Si-containing film forming composition 110 may be in solid or liquid form. An inert gas, including but not limited to nitrogen, argon, helium, and mixtures thereof, is introduced into the inlet conduit 300. The inert gas bubbles through the Si-containing film forming composition 110 and carries a mixture of the inert gas and vaporized Si-containing film forming composition 110 to the outlet conduit 400 and on to the reactor.

FIGS. 3 and 4 include valves 600 and 700. One of ordinary skill in the art will recognize that valves 600 and 700 may be placed in an open or closed position to allow flow through conduits 300 and 400, respectively. Either delivery device 101 in FIGS. 3 and 4, or a simpler delivery device having a single conduit terminating above the surface of any solid or liquid present, may be used if the Si-containing film forming composition 110 is in vapor form or if sufficient vapor pressure is present above the solid/liquid phase. In this case, the Si-containing film forming composition 110 is delivered in vapor form through the conduit 300 or 400 simply by opening the valve 600 in FIG. 3 or 700 in FIG. 4. The delivery device 101 may be maintained at a suitable temperature to provide sufficient vapor pressure for the Si-containing film forming composition 110 to be delivered in vapor form, for example by the use of an optional heating element 140.

While FIGS. 3 and 4 disclose two embodiments of the Si-containing film forming composition delivery device 101, one of ordinary skill in the art will recognize that the inlet conduit 300 and outlet conduit 400 may also both be located above or below the surface of the Si-containing film forming composition 110 without departing from the disclosure herein. Furthermore, inlet conduit 300 may be a filling port.

The vapors of solid forms of the Si-containing film forming compositions may be delivered to the reactor using a sublimator. FIG. 5 shows one embodiment of an exemplary sublimator 100. The sublimator 100 comprises a container 33. Container 33 may be a cylindrical container, or alternatively, may be any shape, without limitation. The container 33 is constructed of materials such as passivated stainless steel, aluminum oxide, glass, and other chemically compatible materials, without limitation. In certain instances, the container 33 is constructed of another metal or metal alloy, without limitation. In certain instances, the container 33 has an internal diameter from about 8 centimeters to about 55 centimeters and, alternatively, an internal diameter from about 8 centimeters to about 30 centimeters. As understood by one skilled in the art, alternate configurations may have different dimensions.

Container 33 comprises a sealable top 15, sealing member 18, and gasket 20. Sealable top 15 is configured to seal container 33 from the outer environment. Sealable top 15 is configured to allow access to the container 33. Additionally, sealable top 15 is configured for passage of conduits into container 33. Alternatively, sealable top 15 is configured to permit fluid flow into container 33. Sealable top 15 is configured to receive and pass through a conduit comprising a dip tube 92 to remain in fluid contact with container 33. Dip tube 92 having a control valve 90 and a fitting 95 is configured for flowing carrier gas into container 33. In certain instances, dip tube 92 extends down the center axis of container 33. Further, sealable top 15 is configured to receive and pass through a conduit comprising outlet tube 12. The carrier gas and vapor of the Si-containing film forming composition is removed from container 33 through the outlet tube 12. Outlet tube 12 comprises a control valve 10 and fitting 5. In certain instances, outlet tube 12 is fluidly coupled to a gas delivery manifold, for conducting carrier gas from the sublimator 100 to the reactor.

Container 33 and sealable top 15 are sealed by at least two sealing members 18; alternatively, by at least about four sealing members. In certain instance, sealable top 15 is sealed to container 33 by at least about eight sealing members 18. As understood by one skilled in the art, sealing member 18 releasably couples sealable top 15 to container 33, and forms a gas resistant seal with gasket 20. Sealing member 18 may comprise any suitable means known to one skilled in the art for sealing container 33. In certain instances, sealing member 18 comprises a thumbscrew.

As illustrated in FIG. 5, container 33 further comprises at least one disk disposed therein. The disk comprises a shelf, or horizontal support, for solid material. In certain embodiments, an interior disk 30 is disposed annularly within the container 33, such that the disk 30 includes an outer diameter or circumference that is less than the inner diameter or circumference of the container 33, forming an opening 31. An exterior disk 86 is disposed circumferentially within the container 33, such that the disk 86 comprises an outer diameter or circumference that is the same, about the same, or generally coincides with the inner diameter of the container 33. Exterior disk 86 forms an opening 87 disposed at the center of the disk. A plurality of disks is disposed within container 33. The disks are stacked in an alternating fashion, wherein interior disks 30, 34, 36, 44 are vertically stacked within the container with alternating exterior disks 62, 78, 82, 86. In embodiments, interior disks 30, 34, 36, 44 extend annularly outward, and exterior disks 62, 78, 82, 86 extend annularly toward the center of container 33. As illustrated in the embodiment of FIG. 5, interior disks 30, 34, 36, 44 are not in physical contact with exterior disks 62, 78, 82, 86.

The assembled sublimator 100 comprises interior disks 30, 34, 36, 44 comprising aligned and coupled support legs 50, interior passage 51, concentric walls 40, 41, 42, and concentric slots 47, 48, 49. The interior disks 30, 34, 36, 44 are vertically stacked, and annularly oriented about the dip tube 92. Additionally, the sublimator comprises exterior disks 62, 78, 82, 86. As illustrated in FIG. 5, the exterior disks 62, 78, 82, 86 should be tightly fit into the container 33 for a good contact for conducting heat from the container 33 to the disks 62, 78, 82, 86. Preferably, the exterior disks 62, 78, 82, 86 are coupled to, or in physical contact with, the inner wall of the container 33.

As illustrated, exterior disks 62, 78, 82, 86 and interior disks 30, 34, 36, 44 are stacked inside the container 33. When assembled in container 33 to form sublimator 100, the interior disks 30, 34, 36, 44 form outer gas passages 31, 35, 37, 45 between the assembled exterior disks 62, 78, 82, 86. Further, exterior disks 62, 78, 82, 86 form inner gas passages 56, 79, 83, 87 with the support legs of the interior disks 30, 34, 36, 44. The concentric walls 40, 41, 42 of interior disks 30, 34, 36, 44 form the grooved slots for holding solid precursors. Exterior disks 62, 78, 82, 86 comprise walls 68, 69, 70 for holding solid precursors. During assembly, the solid precursors are loaded into the concentric slots 47, 48, 49 of interior disks 30, 34, 36, 44 and annular slots 64, 65, 66 of exterior disks 62, 78, 82, 86.

Solid powders and/or granular particles of sizes less than about 1 centimeter, alternatively less than about 0.5 centimeter, and alternatively less than about 0.1 centimeter are loaded into the concentric slots 47, 48, 49 of interior disks 30, 34, 36, 44 and annular slots 64, 65, 66 of exterior disks 62, 78, 82, 86. The solid precursors are loaded into the annular slots of each disk by any method suitable for uniform distribution of solid in the annular slots. Suitable methods include direct pour, using a scoop, using a funnel, automated measured delivery, and pressurized delivery, without limitation. Depending on the chemical properties of the solid precursor materials, loading may be conducted in a sealed environment. Additionally, inert gas atmosphere and/or pressurization in a sealed box may be implemented for those toxic, volatile, oxidizable, and/or air sensitive solids. Each disk could be loaded after setting the disk in the container 33. A more preferred procedure is to load the solid prior to setting the disk into container 33. The total weight of solid precursor loaded into the sublimator may be recorded by weighing the sublimator before and after loading process. Further, consumed solid precursor may be calculated by weighing the sublimator after the vaporization and deposition process.

Dip tube 92, having the control valve 90 and the fitting 95, is positioned in the interior passage 51 of the aligned and coupled support legs of the interior disks 30, 34, 36, 44. Thus, dip tube 92 passes through interior passage 51 vertically toward bottom 58 of container 33. The dip tube end 55 is disposed proximal to the bottom 58 of container at/or above the gas windows 52. Gas windows 52 are disposed in bottom interior disk 44. The gas windows 52 are configured to allow carrier gas flow out of the dip tube 92. In the assembled sublimator 100, a gas passageway 59 is formed by the bottom 58 of the container 33, and the bottom interior disk 44. In certain instances, gas passageway 59 is configured to heat carrier gas.

In operation, the carrier gas is preheated prior to introduction into the container 33 via dip tube 92. Alternatively, the carrier gas can be heated while it flows through the gas passageway 59 by the bottom 58 of the container 33. Bottom 58 of the container 33 is thermally coupled and/or heated by an external heater consistently with the teachings herein. The carrier gas then passes through the outer gas passage 45 that is formed by the concentric wall 42 of the interior disk 44 and the outside wall 61 of the exterior disk 62. The outer gas passage 45 leads to the top of the interior disk 44. The carrier gas continuously flows over the top of the solid precursors loaded into the concentric slots 47, 48, and 49. Sublimed solid vapor from concentric slots 47, 48, 49 is mixed with carrier gas and is flowed vertically upward through container 33.

While FIG. 5 discloses one embodiment of a sublimator capable of delivering the vapor of any solid Si-containing film forming composition to the reactor, one of ordinary skill in the art will recognize that other sublimator designs may also be suitable, without departing from the teachings herein. Finally, one of ordinary skill in the art will recognize that the disclosed Si-containing film forming composition may be delivered to semiconductor processing tools using other delivery devices, such as the ampoules disclosed in WO 2006/059187 to Jurcik et al., without departing from the teachings herein.

If necessary, the Si-containing film forming composition delivery devices of FIGS. 3-5 may be heated to a temperature that permits the Si-containing film forming composition to be in its liquid phase and to have a sufficient vapor pressure. The delivery device may be maintained at temperatures in the range of, for example, 0-150° C. Those skilled in the art recognize that the temperature of the delivery device may be adjusted in a known manner to control the amount of Si-containing film forming composition vaporized.

In addition to the disclosed composition, a reaction gas may also be introduced into the reactor. The reaction gas may be an oxidizing agent such as $O_2$; $O_3$; $H_2O$; $H_2O_2$; oxygen containing radicals such as O. or OH.; NO; $NO_2$; carboxylic acids such as formic acid, acetic acid, propionic acid; radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the co-reactant is plasma treated oxygen, ozone, or combinations thereof. When an oxidizing gas is used, the resulting silicon containing film will also contain oxygen.

Alternatively, the reaction gas may $H_2$, $NH_3$, $(SiH_3)_3N$, hydridosilanes (such as $SiH_4$, $Si_2H_6$, $Si_3H_8$, $Si_4H_{10}$, $Si_5H_{10}$, $Si_6H_{12}$), chlorosilanes and chloropolysilanes (such as $SiHCl_3$, $SiH_2Cl_2$, $SiH_3Cl$, $Si_2Cl_6$, $Si_2HCl_5$, $Si_3Cl_8$), alkylsilanes (such as $Me_2SiH_2$, $Et_2SiH_2$, $MeSiH_3$, $EtSiH_3$), hydrazines (such as $N_2H_4$, $MeHNNH_2$, $MeHNNHMe$), organic amines (such as $NMeH_2$, $NEtH_2$, $NMe_2H$, $NEtH_2$, $NMe_3$, $NEt_3$, $(SiMe_3)_2NH$), diamines such as ethylene diamine, dimethylethylene diamine, tetramethylethylene diamine, pyrazoline, pyridine, B-containing molecules (such as $B_2H_6$, trimethylboron, triethylboron, borazine, substituted borazine, dialkylaminoboranes), alkyl metals (such as trimethylaluminum, triethylaluminum, dimethylzinc, diethylzinc), radical species thereof, or mixtures thereof. When $H_2$ or an inorganic Si containing gas is used, the resulting silicon containing film may be pure Si.

Alternatively, the reaction gas may be a hydrocarbon, saturated or unsaturated, linear, branched or cyclic, such as but not limited to ethylene, acetylene, propylene, isoprene, cyclohexane, cyclohexene, cyclohexadiene, pentene, pentyne, cyclopentane, butadiene, cyclobutane, terpinene, octane, octene, or combinations thereof.

The reaction gas may be treated by a plasma, in order to decompose the reaction gas into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The desired silicon-containing film also contains another element, such as, for example and without limitation, B, P, As, Zr, Hf, Ti, Nb, V, Ta, Al, Si, or Ge.

The Si-containing film forming composition and one or more co-reactants may be introduced into the reaction chamber simultaneously (chemical vapor deposition), sequentially (atomic layer deposition), or in other combinations. For example, the vapor of the Si-containing film forming composition may be introduced in one pulse and two additional metal sources may be introduced together in a separate pulse (modified atomic layer deposition). Alternatively, the reaction chamber may already contain the co-reactant prior to introduction of the Si-containing film forming composition. The co-reactant may be passed through a plasma system localized within or remote from the reaction chamber, and decomposed to radicals. Alternatively, the Si-containing film forming composition may be introduced to the reaction chamber continuously while other precursors or reactants are introduced by pulse (pulsed-chemical vapor deposition). In another alternative, the Si-containing film forming composition and one or more co-reactants may be simultaneously sprayed from a shower head under which a susceptor holding several wafers is spun (spatial ALD).

In one non-limiting exemplary atomic layer deposition process, the vapor phase of the Si-containing film forming composition is introduced into the reaction chamber, where it is contacted with a suitable substrate. Excess composition may then be removed from the reaction chamber by purging and/or evacuating the reaction chamber. An oxygen source is introduced into the reaction chamber where it reacts with the absorbed Si—H containing iodosilane in a self-limiting manner. Any excess oxygen source is removed from the reaction chamber by purging and/or evacuating the reaction chamber. If the desired film is a silicon oxide film, this two-step process may provide the desired film thickness or may be repeated until a film having the necessary thickness has been obtained.

Alternatively, if the desired film is a silicon metal/metalloid oxide film (i.e., $SiMO_x$, wherein x may be 0-4 and M is B, Zr, Hf, Ti, Nb, V, Ta, Al, Si, Ga, Ge, or combinations thereof), the two-step process above may be followed by introduction of a vapor of a metal- or metalloid-containing precursor into the reaction chamber. The metal- or metalloid-containing precursor will be selected based on the nature of the silicon metal/metalloid oxide film being deposited. After introduction into the reaction chamber, the metal- or metalloid-containing precursor is contacted with the substrate. Any excess metal- or metalloid-containing precursor is removed from the reaction chamber by purging and/or evacuating the reaction chamber. Once again, an oxygen source may be introduced into the reaction chamber to react with the metal- or metalloid-containing precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the Si-containing film forming composition, metal- or metalloid-containing precursor, and oxygen source, a film of desired composition and thickness can be deposited.

Additionally, by varying the number of pulses, films having a desired stoichiometric M:Si ratio may be obtained. For example, a $SiMO_2$ film may be obtained by having one pulse of the Si-containing film forming composition and one pulse of the metal- or metalloid-containing precursor, with each pulse being followed by a pulse of the oxygen source. However, one of ordinary skill in the art will recognize that the number of pulses required to obtain the desired film may not be identical to the stoichiometric ratio of the resulting film.

The silicon-containing films resulting from the processes discussed above may include $SiO_2$; SiC; SiN; SiON; SiOC; SiONC; SiBN; SiBCN; SiCN; SiMO, SiMN in which M is selected from Zr, Hf, Ti, Nb, V, Ta, Al, Ge, depending of course on the oxidation state of M. One of ordinary skill in the art will recognize that by judicial selection of the appropriate Si-containing film forming composition and co-reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, or combinations thereof. Most preferably, the temperature is 600° C. for less than 3600 seconds. Even more preferably, the temperature is less than 400° C. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially UV-curing, has been found effective to enhance the connectivity and cross linking of the film, and to reduce the H content of the film when the film is a SiN containing film. Typically, a combination of thermal annealing to <400° C. (preferably about 100° C.–300° C.) and UV curing is used to obtain the film with the highest density.

EXAMPLES

The following non-limiting examples are provided to further illustrate embodiments of the invention. However, the examples are not intended to be all inclusive and are not intended to limit the scope of the inventions described herein.

Example 1

A 250 mL, 3-neck (24/40) European style flask with PTFE-coated magnetic stir bar was charged with 9.56 g (33.7 mmol) anhydrous lithium iodide powder (Sigma Aldrich, 99+%) and 80 mL anhydrous chloroform. Dichlorosilane (8.4 g; 83.2 mmol, excess)("DCS") was added to the reaction flask through the headspace while the mixture was stirred. An immediate color change was observed (light purple coloration). The temperature rose from ~22 to 29° C. during DCS exposure. The mixture was stirred for an additional 18 hours at ambient temperature. The solids changed in appearance from a coarse morphology with beige coloration to white, finely divided powder. The mass of the solids decreased over this time. The solids were filtered and dried under vacuum (2.75 g collected; 3.0 g calculated). The solvent was removed under static vacuum by condensation into a trap cooled in liquid nitrogen. The remaining purple liquid was weighed (4.54 g; 10.0 g calculated; 45%) and analyzed by GCMS (80.5% $SiH_2I_2$ ("DIS"), remaining balance were higher boiling compounds). While the calculated product yield was unreliable due to sample size and the means in which chloroform was removed, this example demonstrates successful halide exchange to produce the DIS product.

Example 2

A similar reaction was done using the same setup and reagent load explained in Example 1 except that toluene was used instead of chloroform. GC sample analysis of the liquid (no further workup) revealed that DIS was the main product (sans solvent) with some DCS, and $ClSiH_2I$.

Example 3

A 60 cc stainless steel ampule with diaphragm valve and pressure gauge was charged with 4.25 g (31.7 mmol) anhydrous lithium iodide in a nitrogen purged glove box. The nitrogen gas was removed under vacuum and DCS (1.60 g, 15.9 mmol) added by condensation (−196° C.). The container was then closed and allowed to thaw to ambient temperature and let stand for 30 minutes. Toluene extraction was performed. The toluene extracts were analyzed by GCMS, which revealed DCS, $ClSiH_2I$ intermediate and DIS (main product). This example demonstrates that the process may be completed without the use of a solvent.

Example 4

Sodium iodide powder (10.61 g; granular, colorless, crystalline solid) was exposed under static vacuum to excess DCS gas in a 50 cc Schlenk tube with no visual indication of a reaction. No pressure change was observed. The DCS was then condensed into the Schlenk tube and thawed to ambient temperature several times with no indication of reagent volume loss, color or pressure change (no reaction). Reactions with sodium iodide would likely require a solvent in which it has some solubility (i.e. methylene chloride, chloroform, acetonitrile, etc.). Lithium iodide is clearly more reactive and preferable. This example demonstrates that the NaI alkali metal halide reactant is not as reactive as LiI.

Example 5

Figure 6:
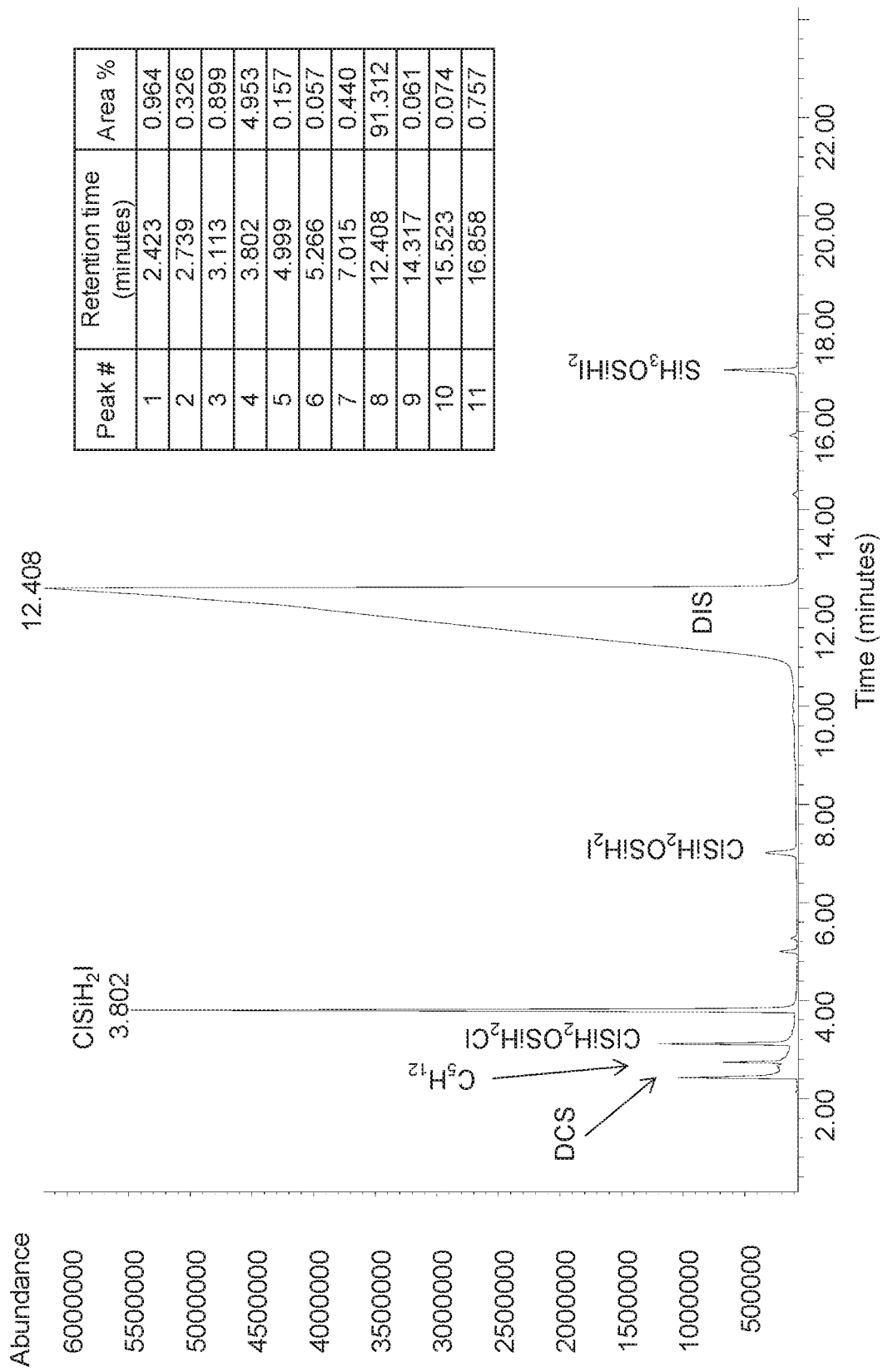
FIG. 6 is a Gas Chromatographic/Mass Spectrometric (GC/MS) graph of the SiH$_2$I$_2$ reaction product of Example 5.

530 g product scale in pentane solvent: A 2 L, 3-neck round bottom (RB) flask with PTFE coated stir bar was charged with 500 g anhydrous LiI (solid)(3.74 mol; Acros Organics, 99%) and filled with anhydrous n-pentane (liquid) to the 1 L mark. The majority of the headspace nitrogen was removed in vacuo (to approximately 600 torr pressure) and an excess of DCS (liquid)(492 g; 4.87 mol; 2.8×mol excess) was added to the flask through the headspace. The flask was periodically cooled to 5-8° C. to allow full transfer. No stirring was achieved by using a stir plate/stir bar since the LiI solids were too heavy. The mixture was agitated by frequently shaking/swirling the pot manually. The flask was left overnight at room temperature with the magnetic stirrer left on. No stirring was achieved. The solids were filtered and dried under vacuum (169 g recovered; 158 g calculated). The light pink filtrate was distilled to remove pentane (b.p.=36° C.). The remaining colorless liquid was distilled under reduced pressure (ca. 0-5 torr/21-31° C.) with the receiver cooled in dry ice pellets. This resulted in a colorless, frozen solid in the collector with almost no residual liquid left behind in the distillation pot. The solid product was thawed and weighed (350 g; 530 g calculated; 65%). Gas Chromatographic/Mass Spectrometric analysis revealed 91% (area percent) pure DIS with small amounts of DCS (0.964%), pentane (0.326%), $ClSiH_2I$ (4.953%) and impurities tentatively assigned as perchlorinated/periodinated disiloxane compounds (see FIG. 6).

The likely presence of siloxane-type impurities found in Example 5 indicate that these compounds are formed by moisture derived from one or more of the following:
Surface moisture from the glass reactor/distillation system (unlikely).
From an air leak into the system.
Moisture in the lithium iodide starting material (reasonable likelihood). This may also include some level of lithium hydroxide.
Moisture from un-optimized sample preparation and handling for GC analysis (entirely possible).
This highlights the importance of scrupulous measure to eliminate any potential source of moisture throughout the process. Nevertheless, these siloxane impurities seem readily separable from the main product based on their GC elution times.

Example 6

530 g product scale in pentane solvent: A 2 L, 3-neck RB flask with mechanical agitator, cooling cup condenser and ¼" PTFE sparge tube was charged with 500 g anhydrous LiI (3.74 mol; Acros Organics, 99%) and filled with anhydrous n-pentane (liquid) to the 1 L mark. Dichlorosilane (183 g; 1.81 mol) was added subsurface over the course of 22 minutes in which the temperature rose from 18.1 (cold pentane) to 31.0° C. The reaction mixture was stirred vigorously and some reflux was observed during the addition of DCS. The reaction mixture was stirred at ambient temperature for 3 hours and the liquid analyzed by GCMS. The chromatography revealed trace DCS, pentane, $ClSiH_2I$ partially substituted intermediate and DIS. The area percent of $ClSiH_2I$ and DIS was 6 and 13.5%, respectively. The reaction mixture was stirred an additional 18 hours. The solids were then filtered and dried under vacuum (226 g collected, 158 g calculated). The solvent and lower boiling impurities were removed by distillation. Crude DIS (320 g, 89% by GC) was obtained (~62%). A comparison of Examples 5 and 6 demonstrate that varying the stoichiometric ratios of the reactants produces similar yields.

Example 7

500 g of LiI (3.74 moles; 99.9% City Chemical, colorless powder) was charged into a 2 L, 3 neck RB flask with mechanical agitator. A cooling cup condenser and internal thermocouple were attached to the reaction apparatus. Approximately 800 mL anhydrous chloroform was added to the LiI powder. The condenser was cooled to −78° C. and 196 g dichlorosilane (1.94 mol, 3.5 mol % excess) under reduced pressure through the condenser (−78° C. dry ice, isopropyl alcohol slush bath) in 15 minutes with stirring. The pressure was 680 torr at 23° C. Additional nitrogen gas was added to the reactor to a pressure of 780 torr. The mixture was stirred for 22 hours upon which it took on a pink-purple coloration. The solids were filtered and dried under vacuum. The filtrate was collected in a 1 L flask. The chloroform was distilled at 61° C. and the remaining purple liquid collected and weighed (148 g, 28%, crude DIS product post solvent removal). The low yield suggests that pure LiI has limited to low solubility in chloroform. Some level of hydrogenation of the LiI reactant may facilitate reactivity of the salt and promote formation of the product, along with higher siloxane-based impurities.

Example 8

Figure 7:
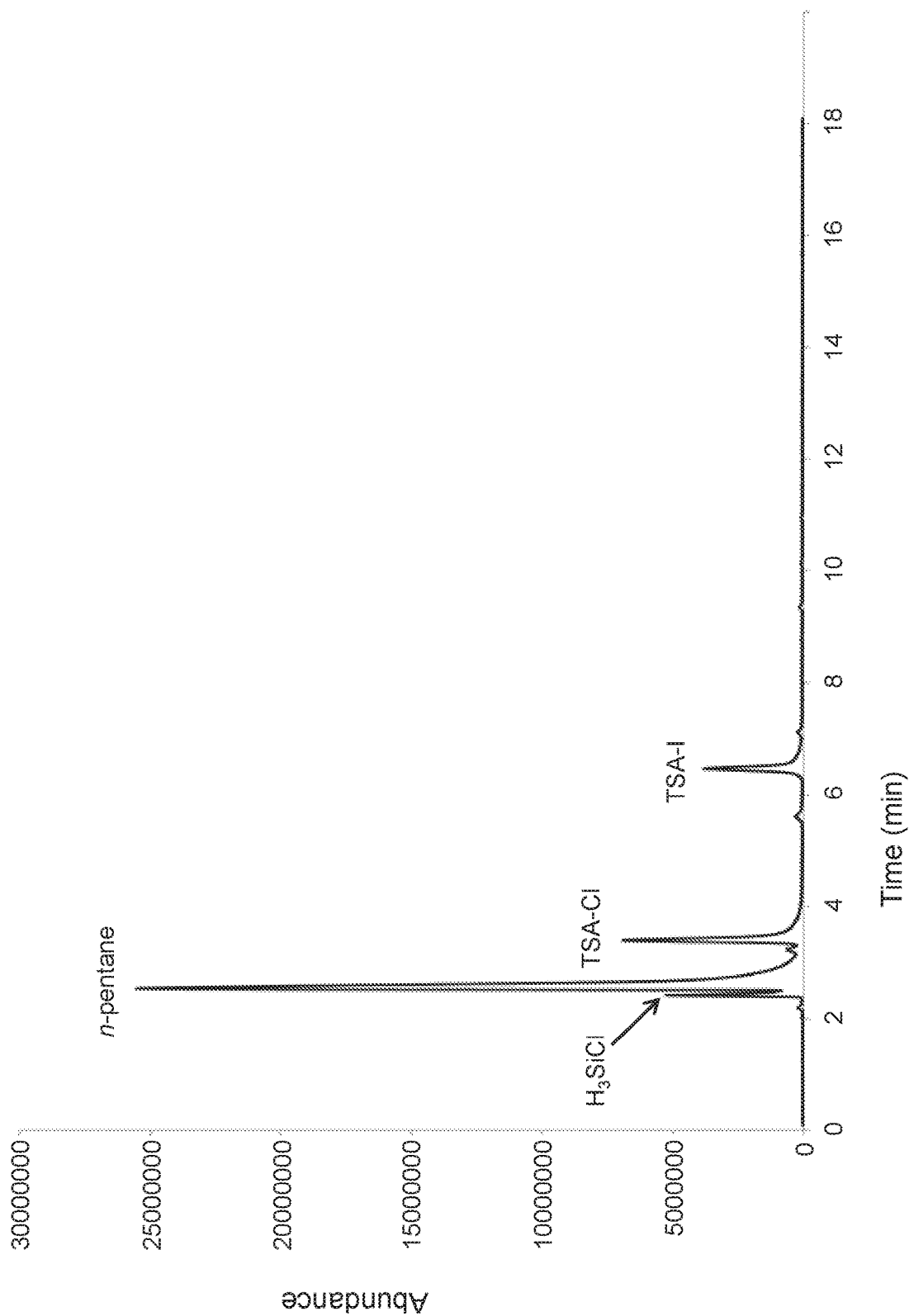
FIG. 7 is a GC/MS graph of the reaction mixture of Example 7 after 90 minutes stirring.

A four neck round bottom flask equipped with a mechanical stirrer, a thermocouple and a dry-ice IPA condenser was charged with LiI (24.8 g, 0.19 mol) under a stream of nitrogen. Pentane (80 mL) was transferred via cannula. To the resulting mixture, TSA-Cl (($SiH_3$)$_2$N($SiH_2$Cl) 25 g, 0.18 mol) was added dropwise over a period of 15 min at room temperature. No exothermicity was observed. After stirring for about 90 min at ambient temperature, the reaction mixture was analyzed by GC-MS which shows 57% unreacted TSA-Cl and 39% TSA-I (($SiH_3$)$_2$N($SiH_2$I)) (FIG. 7). At this point, the reaction mixture was allowed to stir overnight at room temperature. The GC analysis after overnight stirring resulted in a major peak corresponding to $SiH_3$—I and the peaks corresponding to TSA-Cl and TSA-I disappeared. Optimization of the reaction time remains ongoing.

Example 9: Comparison of LI Particle Size 0.5-1 mm LiI
A 20 L jacketed filter reactor equipped with a mechanical stirrer, condenser (regulated to −70° C.), a solid addition port, an inlet tube for sub-surface dichlorosilane addition and an inlet for liquid pentane addition was charged with pentane 15 L. The temperature in the reactor jacket was regulated to +35° C. and the reactor condenser regulated to −70° C. The reactor was then stirred ~200 RPM and while under an atmosphere of Nitrogen, Lithium Iodide (12.25 kg, 91.52 mol) was then charged to the reactor. Subsequent gravimetric addition of dichlorosilane (4.52 kg, 44.75 mol) was regulated at a rate of approximately 1 kg per hour. Following completion of DCS addition, the reactor jacket remains regulated to +35° C. and the condenser to −70° C. After stirring for 16 hours, stirring was stopped and the reactor contents were drained through the reactor filter into a 22 L round bottomed flask. The salts on the reactor filter were then washed with pentane (3×1 L) to furnish 7.19 kg of solid residue. The combined filtrate and washings were subsequently distilled at 88 kPa to furnish crude diiodosilane (9.04 kg, 83% purity). The remainder of the material comprised DCS, 1.3%; pentane, 0.6%; $SiH_2ClI$, 14.1% and $SiHI_3$, 0.1% as suggested by GC analysis. This crude material is further distilled at 3.2 kPa to furnish diiodosilane (7.39 kg, 58% yield), comprising DIS, 99.6%; $SiH_3I$, 0.1%; $SiH_2ClI$, 0.1%; $SiHI_3$, 0.15%, others, 0.12% as suggested by GC analysis. As discussed above, none of these impurities contain any carbon that could negatively affect the resulting Si-containing film.

1-1.25 mm LiI

A 20 L jacketed filter reactor equipped with a mechanical stirrer, condenser (regulated to −70° C.), a solid addition port, an inlet tube for sub-surface dichlorosilane addition and an inlet for liquid pentane addition was charged with 15 L fresh pentane (Sigma Aldrich, >99% purity). The temperature in the reactor jacket was regulated to +35° C. and the reactor condenser regulated to −70° C. The reactor was then stirred 200 RPM and while under an atmosphere of Nitrogen, Lithium Iodide (9.99 kg, 74.64 mol) was then charged to the reactor. Subsequent gravimetric addition of dichlorosilane (3.88 kg, 38.42 mol) was regulated at a rate of approximately 1 kg per hour. Following completion of DCS addition, the reactor jacket remains regulated to +35° C. and the condenser to −70° C. After stirring for 16 hours, stirring was stopped and the reactor contents were drained through the reactor filter into a 22 L round bottomed flask. The salts on the reactor filter were then washed with pentane (3×1 L) to furnish 4.96 kg of solid residue. The combined filtrate and washings were subsequently distilled at 88 kPa to furnish crude diiodosilane (8.01 kg, 86% purity). The remainder of the material comprised DCS, 0.1%, pentane, 1.2%; $SiH_3I$, 0.1%, $SiH_2ClI$, 4.5% and $SiHI_3$, 0.1% as suggested by GC analysis. This crude material is further distilled at 3.2 kPa to furnish diiodosilane (8.16 kg, 77% yield), comprising DIS, 99.7%; $SiH_3I$, 0.01%; $SiH_2ClI$, 0.03% and $SiHI_3$, 0.1%. As discussed above, none of these impurities contain any carbon that could negatively affect the resulting Si-containing film.

These results also show that the particle size of Lithium Iodide influences the isolated yield. Surprisingly, improved yields are observed when a larger particle size of Lithium Iodide is employed relative to a smaller particle size.

Example 10: Effect of Solvent Recycling

Solvent Recycling

A 20 L jacketed filter reactor equipped with a mechanical stirrer, condenser (regulated to −70° C.), a solid addition port, an inlet tube for sub-surface dichlorosilane addition and an inlet for liquid pentane addition was charged with 15 L pentane. The temperature in the reactor jacket was regulated to +35° C. and the reactor condenser regulated to −70° C. The reactor was then stirred ~200 RPM and while under an atmosphere of Nitrogen, Lithium Iodide (12.34 kg, 92.19 mol) was then charged to the reactor. Subsequent gravimetric addition of dichlorosilane (4.25 kg, 42.08 mol) was regulated at a rate of approximately 1 kg per hour. Following completion of DCS addition, the reactor jacket remains regulated to +35° C. and the condenser to −70° C. After 16 hours stirring, stirring was stopped and the reactor contents were drained through the reactor filter into a 22 L round bottomed flask. The salts on the reactor filter were then washed with pentane (3×1 L). The combined filtrate and washings were subsequently distilled at 88 kPa to furnish crude diiodosilane (9.26 kg, 82% purity) in the distillation pot. The distillate (11 L, comprising mostly of pentane, 82%; DCS, 12%; $SiH_2ClI$, 4% and DIS, 1%) was recycled back to the reactor for a consecutive synthesis.

Accordingly, the aforementioned 20 L jacketed filter reactor equipped with a mechanical stirrer, condenser (regulated to −70° C.), solid addition port, inlet tube for sub-surface dichlorosilane addition and an inlet for distillate/pentane addition was charged with the recycled distillate (11 L, comprising mostly of pentane, 82%; DCS, 12%; $SiH_2ClI$, 4% and DIS, 1%) from the previous production run together with fresh pentane (4 L). The temperature in the reactor jacket was regulated to +35° C. and the reactor condenser regulated to −70° C. The reactor was then stirred ~200 RPM and while under an atmosphere of Nitrogen, Lithium Iodide (12.38 kg, 92.49 mol) was then charged to the reactor. Subsequent gravimetric addition of dichlorosilane (4.17 kg, 41.28 mol) was regulated at a rate of approximately 1 kg per hour. Following completion of DCS addition, the reactor jacket remains regulated to +35° C. and the condenser to −70° C. After 17 hours stirring, stirring was stopped and the reactor contents were drained through the reactor filter into a 22 L round bottomed flask. The salts on the reactor filter were then washed with pentane (3×1 L). The combined filtrate and washings were subsequently distilled at 88 kPa to furnish crude diiodosilane (8.77 kg, 84% purity) as distillation bottoms in the distillation pot. This crude material is further distilled at 3.2 kPa to furnish diiodosilane (7.29 kg, 62% yield), comprising DIS, 99.5%; $SiH_3I$, 0.14%; $SiHI_3$, 0.24%, others, 0.12%.

Fresh Solvent

A 20 L jacketed filter reactor equipped with a mechanical stirrer, condenser (regulated to −70° C.), a solid addition port, an inlet tube for sub-surface dichlorosilane addition and an inlet for liquid pentane addition was charged with 15 L fresh pentane (Sigma Aldrich, >99% purity). The temperature in the reactor jacket was regulated to +35° C. and the reactor condenser regulated to −70° C. The reactor was then stirred ~200 RPM and while under an atmosphere of Nitrogen, Lithium Iodide (12.47 kg, 93.16 mol) was then charged to the reactor. Subsequent gravimetric addition of dichlorosilane (4.85 kg, 48.02 mol) was regulated at a rate of approximately 1 kg per hour. Following completion of DCS addition, the reactor jacket remains regulated to +35° C. and the condenser to −70° C. After stirring for 16 hours, stirring was stopped and the reactor contents were drained through the reactor filter into a 22 L round bottomed flask. The salts on the reactor filter were then washed with pentane (3×1 L). The combined filtrate and washings were subsequently distilled at 88 kPa to furnish crude diiodosilane (8.01 kg, 86% purity). This crude material is further distilled at 3.2 kPa to furnish diiodosilane (6.68 kg, 51% yield), comprising DIS, 99.9%; $SiH_3I$, 0.01% and $SiHI_3$, 0.02%.

As can be seen, recycling offers advantages in terms of economic and environmental benefits along with often simplifying regulatory compliance, however, impurities may accumulate. Eliminating the recycling step and using a fresh solvent charge for each synthetic run leads to an ultra-high product purity level that is not attainable after solvent recycling.

Example 11: Material Compatibility

Small pieces of material were submerged in $SiH_2I_2$ (synthesized per method disclosed in US Pat App Pub No 2016/0264426), sealed in a glass pressure tube and maintained in the absence of light at the stated temperature for the stated time period. The initial control assay was 96.9% $SiH_2I_2$ with 1.3% $SiH(Me)I_2$ and 1.6% $SiHI_3$, based on GCMS peak integration. The results are provided below and demonstrate that the stability of $SiH_2I_2$ is difficult to maintain. Applicants believe that the HX or $X_2$ reactants used in that synthesis method contribute to the instability of the $SiH_2I_2$ reaction product demonstrated in the Control results below. As can be seen, some standard packaging materials further accelerate decomposition of the $SiH_2I_2$ product.

Room Temperature:

| Material | 3 weeks | 8 weeks | 12 weeks |
|---|---|---|---|
| Control* | 96.9% $SiH_2I_2$ | 96.1% $SiH_2I_2$ | 95.7% $SiH_2I_2$ |
|  | 1.3% $SiH(Me)I_2$ | 1.3% $SiH(Me)I_2$ | 1.3% $SiH(Me)I_2$ |
|  | 1.6% $SiHI_3$ | 2.4% $SiHI_3$ | 2.8% $SiHI_3$ |
| Stainless Steel (SUS316) | 94.4% $SiH_2I_2$ | 92.4% $SiH_2I_2$ | 94.7% $SiH_2I_2$ |
|  | 1.8% $SiH(Me)I_2$ | 1.6% $SiH(Me)I_2$ | 1.3% $SiH(Me)I_2$ |
|  | 3.5% $SiHI_3$ | 5.6% $SiHI_3$ | 5.8% $SiHI_3$ |
|  |  | 0.1% $SiI_4$ |  |
| Aluminum Oxide (Sapphire) | 97.8% $SiH_2I_2$ | 97.3% $SiH_2I_2$ | 97.3% $SiH_2I_2$ |
|  | 0.9% $SiH(Me)I_2$ | 0.9% $SiH(Me)I_2$ | 0.8% $SiH(Me)I_2$ |
|  | 1.1% $SiHI_3$ | 1.7% $SiHI_3$ | 1.8% $SiHI_3$ |
| Aluminum (A6061) | 0.2% $SiHI_3$ | 0.5% $SiHI_3$ | 0.6% $SiHI_3$ |
|  | 91.9% $SiH_2I_2$ | 93.6% $SiH_2I_2$ | 92.4% $SiH_2I_2$ |
|  | 1.0% $SiH(Me)I_2$ | 0.9% $SiH(Me)I_2$ | 0.8% $SiH(Me)I_2$ |
|  | 5.0% $SiHI_3$ | 5.0% $SiHI_3$ | 6.2% $SiHI_3$ |
|  | 03% $SiI_4$ |  |  |
| Aluminum (4NGM) | 0.2% $SiHI_3$ | 0.8% $SiHI_3$ | 1.1% $SiHI_3$ |
|  | 92.0% $SiH_2I_2$ | 89.6% $SiH_2I_2$ | 87.4% $SiH_2I_2$ |
|  | 1.1% $SiH(Me)I_2$ | 0.9% $SiH(Me)I_2$ | 0.9% $SiH(Me)I_2$ |
|  | 5.9% $SiHI_3$ | 8.1% $SiHI_3$ | 10.0% $SiHI_3$ |
|  | 0.2% $SiI_4$ | 0.5% $SiI_4$ | 0.4% $SiI_4$ |
| Aluminum Oxide ($Al_2O_3$) | 97.8% $SiH_2I_2$ | 97.1% $SiH_2I_2$ | 95.9% $SiH_2I_2$ |
|  | 0.9% $SiH(Me)I_2$ | 0.8% $SiH(Me)I_2$ | 0.8% $SiH(Me)I_2$ |
|  | 1.1% $SiHI_3$ | 1.9% $SiHI_3$ | 3.2% $SiHI_3$ |
| Aluminum nitride (AlN-ceramic) | 95.0% $SiH_2I_2$ | 96.2% $SiH_2I_2$ | 94.0% $SiH_2I_2$ |
|  | 1.1% $SiH(Me)I_2$ | 1.0% $SiH(Me)I_2$ | 1.0% $SiH(Me)I_2$ |
|  | 3.6% $SiHI_3$ | 2.6% $SiHI_3$ | 4.8% $SiHI_3$ |

*Different starting material: 97.6% $SiH_2I_2$, 0.9% $SiH(Me)I_2$, and 0.9% $SiH_3$.

40° C.

| Material | 3 weeks | 8 weeks | 12 weeks |
|---|---|---|---|
| Control* | 95.8% $SiH_2I_2$ | 94.4% $SiH_2I_2$ | 92.8% $SiH_2I_2$ |
|  | 1.0% $SiH(Me)I_2$ | 1.1% $SiH(Me)I_2$ | 1.0% $SiH(Me)I_2$ |
|  | 2.9% $SiHI_3$ | 4.2% $SiHI_3$ | 6.1% $SiHI_3$ |
| Stainless Steel (SUS316) | 94.9% $SiH_2I_2$ | 93.8% $SiH_2I_2$ | 91.5% $SiH_2I_2$ |
|  | 1.0% $SiH(Me)I_2$ | 0.9% $SiH(Me)I_2$ | 0.9% $SiH(Me)I_2$ |
|  | 3.8% $SiHI_3$ | 5.3% $SiHI_3$ | 7.4% $SiHI_3$ |
| Aluminum Oxide (Sapphire) | 92.9% $SiH_2I_2$ | 86.8% $SiH_2I_2$ | 0.1% $SiHI_3$ |
|  | 1.3% $SiH(Me)I_2$ | 2.3% $SiH(Me)I_2$ | 83.2% $SiH_2I_2$ |
|  | 5.3% $SiHI_3$ | 10.6% $SiHI_3$ | 1.9% $SiH(Me)I_2$ |
|  |  |  | 14.5% $SiHI_3$ |
| Aluminum (A6061) | 0.7% $SiHI_3$ | 1.6% $SiHI_3$ | 2.0% $SiHI_3$ |
|  | 88.6% $SiH_2I_2$ | 83.6% $SiH_2I_2$ | 78.8% $SiH_2I_2$ |
|  | 0.8% $SiH(Me)I_2$ | 0.6% $SiH(Me)I_2$ | 0.5% $SiH(Me)I_2$ |
|  | 9.3% $SiHI_3$ | 13.7% $SiHI_3$ | 18.4% $SiHI_3$ |
|  |  | 0.1% $SiI_4$ | 0.3% $SiI_4$ |
| Aluminum (4NGM) | 0.6% $SiHI_3$ | 1.2% $SiHI_3$ | 1.9% $SiHI_3$ |
|  | 91.4% $SiH_2I_2$ | 88.3% $SiH_2I_2$ | 81.9% $SiH_2I_2$ |
|  | 0.6% $SiH(Me)I_2$ | 0.6% $SiH(Me)I_2$ | 0.5% $SiH(Me)I_2$ |
|  | 7.3% $SiHI_3$ | 9.9% $SiHI_3$ | 15.6% $SiHI_3$ |
| Aluminum Oxide ($Al_2O_3$) | 96.9% $SiH_2I_2$ | 95.8% $SiH_2I_2$ | 94.0% $SiH_2I_2$ |
|  | 0.9% $SiH(Me)I_2$ | 0.7% $SiH(Me)I_2$ | 0.8% $SiH(Me)I_2$ |
|  | 2.0% $SiHI_3$ | 3.4% $SiHI_3$ | 5.1% $SiHI_3$ |
| Aluminum nitride (AlN-ceramic) | 96.1% $SiH_2I_2$ | 91.0% $SiH_2I_2$ | 89.4% $SiH_2I_2$ |
|  | 0.8% $SiH(Me)I_2$ | 0.8% $SiH(Me)I_2$ | 0.8% $SiH(Me)I_2$ |
|  | 3.0% $SiHI_3$ | 8.1% $SiHI_3$ | 9.8% $SiHI_3$ |

*Different starting material: 97.6% $SiH_2I_2$, 0.9% $SiH(Me)I_2$, and 0.9% $SiH_3$.

Example 11: Stability

SiH$_2$I$_2$ synthesized per the methods disclosed herein was stored at room temperature in passivated stainless steel cylinders. Assays were performed using GCMS peak integration prior to and after storage in the cylinders. The table below demonstrates that this product maintains its purity without the need for any stabilizer.

| Sample | Initial Assay | Post storage Assay | Time Period |
|---|---|---|---|
| 1 | 99.3% | 99.1% | 21 days |
| 2 | 99.8% | 99.4% | 3 months |
| 3 | 99.7% | 99.0% | 40 days |
| 4 | 99.7% | 99.3% | 40 days |

Example 12 Dynamic Thermal Stability

Liquid and gas phase DIS samples were analyzed by gas chromatography equipped with a thermal conductivity detector (GC-TCD) or GCMS over 282 days under dynamic conditions that mimic the "vapor drawn mode" of operation that may be used in some atomic layer deposition processes. The "vapor drawn mode" is accomplished using a He inert gas in the Si-containing film forming composition delivery device similar to that of FIGS. 3 and 4, with the ends of both the inlet and outlet located above the surface of the Si-containing film forming composition. The device initially contained 1 kg of DIS and was maintained at 35° C. during testing. The liquid phase DIS samples were taken from the delivery device. The gas phase DIS samples were taken from a sampling port of a delivery line connected to the outlet port of the delivery device. The results are summarized in the table below:

| | Start Liquid Phase GC-TCD | ⅔ Usage Liquid Phase GC-TCD | ⅔ Usage Gas Phase GC-MS | >95% Usage Liquid Phase GC-TCD | >95% Usage Gas Phase GC-MS |
|---|---|---|---|---|---|
| SiH$_3$I | 0.25% | ND | ND | ND | ND |
| SiHI$_3$ | 0.34% | 2.6% | ND | 19.59% | ND |
| SiH$_2$I$_2$ | 99.27% | 97.31% | >99.9% | 80.41% | >99.9% |

As shown above, despite some apparent disproportionation that occurs in the liquid phase during depletion of the dispensing device as illustrated by the decrease in DIS composition at ⅔ and >95% usage, the purity of the gas phase remains high and of semiconductor grade quality. Therefore, liquid DIS synthesized according to the methods disclosed herein delivers a stable composition of vapor phase DIS to the vapor deposition tool without the need for any stabilizer.

Prophetic Example: Synthesis of I$_3$Si—CH$_2$—SiI$_3$

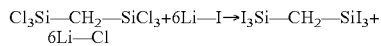

Under inert and anhydrous conditions, a flask will *be* charged with lithium iodide and pentane or other suitable solvent followed by slow addition of a solution or solvent free liquid bis(trichlorosilyl)methane. Th*e* suspension will *be* stirred vigorously until the completion of the reaction is observed by disappearance of bis(trichlorosilyl)methane in a GCMS trace of an aliquot of the reaction mixture. Th*e* resultant suspension will *be* filtered over a medium glass frit loaded with a pad of diatomaceous earth to yield a pentane solution of the desired product. Th*e* bis(triiodosilyl)methane product will *be* isolated in pure form by reduced pressure distillation and/or sublimation.

The reactants are commercially available or may be synthesized according to J. Organomet. Chem. 92, 1975 163-168.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method of synthesizing a Si—H containing iodosilane having the formula Si$_w$H$_x$I$_z$ or N(SiH$_a$I$_c$)$_3$, wherein w=1 to 3, x+z=2w+2, x=1 to 2w+1, z=1 to 2w+1, each a is independently 0 to 3, each c is independently 0 to 3, a+c=3, provided that at least one a is 1 and at least one c is 1, the method comprising:
   contacting a halosilane reactant having the formula Si$_w$H$_x$X$_z$ or N(SiH$_a$X$_c$)$_3$, wherein X is Cl or Br, and w, x, z, a, and c are as defined above, with an alkali metal halide reactant having the formula MI, wherein M is Li, Na, K, Rb, or Cs, to produce a combination of MX and Si$_w$H$_x$I$_z$ or N(SiH$_a$I$_c$)$_3$; and
   isolating the mixture to produce the Si—H containing iodosilane having the formula Si$_w$H$_x$I$_z$ or N(SiH$_a$I$_c$)$_3$.

2. The method of claim 1, wherein the halosilane reactant is SiH$_2$Cl$_2$.

3. The method of claim 2, wherein the alkali metal halide reactant is LiI.

4. The method of claim 1, wherein the halosilane reactant is Si$_2$HCl$_5$.

5. The method of claim 1, wherein the halosilane reactant is (SiH$_3$)$_2$N(SiH$_2$Cl).

6. The method of claim 1, wherein the alkali metal halide reactant is LiI.

\* \* \* \* \*